(12) United States Patent
Johansson et al.

(10) Patent No.: US 10,530,399 B2
(45) Date of Patent: Jan. 7, 2020

(54) LINEARIZATION OF ACTIVE ANTENNA ARRAY

(71) Applicant: Telefonaktiebolaget LM Ericsson (publ), Stockholm (SE)

(72) Inventors: Bernt Johansson, Värmdö (SE); Farshid Ghasemzadeh, Sollentuna (SE); Jan-Erik Thillberg, Stockholm (SE); Leonard Rexberg, Hässelby (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 15/773,056

(22) PCT Filed: Nov. 27, 2015

(86) PCT No.: PCT/SE2015/051277
§ 371 (c)(1),
(2) Date: May 2, 2018

(87) PCT Pub. No.: WO2017/091119
PCT Pub. Date: Jun. 1, 2017

(65) Prior Publication Data
US 2018/0316367 A1 Nov. 1, 2018

(51) Int. Cl.
*H04B 1/04* (2006.01)
*H03F 1/32* (2006.01)

(52) U.S. Cl.
CPC .............. *H04B 1/0475* (2013.01); *H03F 1/32* (2013.01); *H03F 1/3247* (2013.01); *H03F 1/3276* (2013.01); *H04B 2001/0425* (2013.01)

(58) Field of Classification Search
CPC combination set(s) only.
See application file for complete search history.

(56) References Cited

U.S. PATENT DOCUMENTS 7,961,045 B2 * 6/2011 Morris .................. H03F 1/0288
330/149
8,391,809 B1 * 3/2013 Fuller .................. H04B 1/0475
455/114.3

(Continued)

FOREIGN PATENT DOCUMENTS

GB 2466708 A 7/2010

OTHER PUBLICATIONS

International Search Report and Written Opinion for International Patent Application No. PCT/SE2015/051277, dated Aug. 11, 2016, 9 pages.

*Primary Examiner* — Linda Wong
(74) *Attorney, Agent, or Firm* — Patent Portfolio Builders, PLLC

(57) ABSTRACT

An transmitter arrangement and a method therein are provided for linearization of an active antenna array. The active antenna array comprises a plurality of antenna elements, which are associated with a plurality of power amplifiers. The active antenna array is further associated with a precoder having a number of input and output ports. The method comprises obtaining a first signal provided to the antenna array via a first input port of the precoder. The method further comprises adapting a pre-distorting linearizer connected to the first input port based on the first signal and on feedback from the plurality of antenna elements, resulting from the propagation of the first signal via the precoder, and via the plurality of power amplifiers. Embodiments are also provided for adapting a pre-distorting linearizer based on a plurality of input signals and feedback from the plurality of antenna elements.

20 Claims, 13 Drawing Sheets

(56) References Cited

U.S. PATENT DOCUMENTS

| | | | | |
|---|---|---|---|---|
| 8,831,136 | B2* | 9/2014 | Ishikawa | H04B 15/00 375/295 |
| 8,923,370 | B2* | 12/2014 | Johansson | H04B 1/0007 375/219 |
| 2004/0204109 | A1* | 10/2004 | Hoppenstein | H01Q 1/246 455/562.1 |
| 2006/0210070 | A1* | 9/2006 | Reznik | H04L 25/03343 380/33 |
| 2009/0184763 | A1* | 7/2009 | Kim | H03F 1/3247 330/124 R |
| 2011/0227770 | A1* | 9/2011 | Kaper | H03M 1/1052 341/120 |
| 2011/0235734 | A1* | 9/2011 | Kenington | H04B 7/0623 375/267 |
| 2012/0313700 | A1* | 12/2012 | Bai | H03F 1/3252 330/124 R |
| 2013/0163696 | A1* | 6/2013 | Son | H04B 1/0475 375/297 |
| 2013/0265195 | A1* | 10/2013 | Kenington | H01Q 1/246 342/368 |
| 2014/0292579 | A1* | 10/2014 | Oh | H01Q 3/38 342/372 |
| 2015/0103952 | A1* | 4/2015 | Wang | H04L 27/368 375/297 |
| 2015/0280795 | A1* | 10/2015 | Wimpenny | H03F 1/0222 375/267 |
| 2016/0241277 | A1* | 8/2016 | Rexberg | H04B 1/0475 |
| 2017/0279470 | A1* | 9/2017 | Lee | H04B 1/04 |
| 2017/0310000 | A1* | 10/2017 | Gustavsson | H01Q 1/246 |
| 2019/0058530 | A1* | 2/2019 | Rainish | H04B 7/0617 |

* cited by examiner

LINEARIZATION OF ACTIVE ANTENNA ARRAY

This application is a 35 U.S.C. § 371 national phase filing of International Application No. PCT/SE2015/051277, filed Nov. 27, 2015, the disclosure of which is incorporated herein by reference in its entirety.

TECHNICAL FIELD

The invention applies to the technical field of linearizing of power amplifiers, and in particular to power amplifiers operating in an active antenna array.

BACKGROUND

A radio frequency power amplifier is a type of electronic amplifier used to convert a low-power radio-frequency signal into a larger signal of significant power, typically for driving the antenna of a transmitter. It is typically optimized to have high efficiency, high output Power (P1dB) compression, good return loss on the input and output, good gain, and optimum heat dissipation.

A radio transmitting in the downlink in a communication system is typically designed to deliver a pre-defined power level to an antenna, which is in turn designed to radiate in a certain direction to some User Equipment (UE). In doing so, it is at the same time usually required that the signal has a certain quality, and also, in a system view, required that leakage in adjacent channels/frequencies (spectrum, or spatial) is complying with a certain value, either specified by corresponding standard or sometimes by an official regulation.

The unwanted signal emissions, i.e. the leakage in adjacent channels/frequencies, arise from components in the transmission chain being more or less non-linear, thus causing spectrum broadening. The level of this spectrum broadening may be directly related to the signal quality, regardless of whether the signal is being used as a "wanted signal" or if the signal is being viewed as an interfering signal, i.e. unwanted emissions, to some kind of victim system.

A way to combat these kinds of imperfections, i.e. non-linearities, and ensure that the required level of unwanted emission is kept below a certain limit or value, is to use an analog or digital linearizer to pre-distort the signal in a proper way, so that the unwanted emissions caused by the non-linearity, e.g. of a power amplifier, are canceled in the transmission link. A predistortion circuit inversely models the amplifier's gain and phase characteristics and, when combined with the amplifier, produces an overall system that is more linear and reduces the amplifier's distortion. In essence, "inverse distortion" is introduced into the input of the amplifier, thereby cancelling non-linearities of the amplifier. As radio power amplifiers tend to become more non-linear as their output power increases towards their maximum rated output, predistortion is a way to get more usable power from the amplifier, without having to build a larger, less efficient and more expensive amplifier. Linearization, or predistortion, is a very common approach today. This method is also applied in systems having two or more transmission paths, i.e. radios, in parallel, such as in a so-called active antenna array, or Active Array System (AAS).

However, as the number of active transceivers branches, i.e. transmission paths/radios, increase in an AAS, the complexity of linearizing all of the transmission paths grows dramatically. It is clear that when coming above a certain number of transceiver branches, the processing power and capacity used for the linearizers exceeds the processing power and capacity used for other functionality, and thereby traffic capacity, as well as power efficiency can be severely degraded. Further, as the number of active transceiver branches in an AAS increases, the hardware cost and complexity associated with the linearization becomes a problem.

SUMMARY

It would be desired to reduce the complexity of active antenna systems having a multitude of active antenna branches. This is achieved by embodiments described herein, and defined by the appended set of claims. The embodiments enable linearization of a multitude of parallel power amplifiers in the transmission paths of an antenna array using only one, or a few linearizers, i.e. enable the use of considerably less linearizers than the number of transmission paths. The power amplifiers may all be different in their non-linear characteristics.

An advantage of the embodiments described herein is the ability to pre-distort a manifold of antenna amplifiers with e.g. only one pre-distorter. In a wider sense, a limited number of (one or a few) pre-distorters may serve a large manifold of amplifiers in an active array antenna. This limited number of pre-distorters may be configured to linearize not only in the beam direction of one beam, but actually in several beams at the same time.

A large advantage of embodiments described herein is the possibility to use e.g. one-only pre-distorter for a whole antenna array of amplifiers without the need to pre-distort each amplifier separately. The advantage lies primarily in the reduction of linearizers, hardware for the receive path and in reduction of signal processing to cope with all amplifiers having different non-linear characteristics.

According to a first aspect, a method is provided for linearization of an active antenna array. The method is to be performed by a transmitter arrangement. The active antenna array comprises a plurality of antenna elements, which are associated with a plurality of power amplifiers. The active antenna array is further associated with a precoder, W, having a number of input ports. The method comprises adapting (202, 304) a pre-distorting linearizer connected to a first input port of the precoder W, based on an obtained (201, 301) first signal $X_1$ and on a combination of signals from the plurality of antenna elements resulting from the propagation of $X_1$ via the precoder W, and via the plurality of power amplifiers.

According to a second aspect, a transmitter arrangement is provided for linearization of an active antenna array, where the active antenna array comprises a plurality of antenna elements being associated with a plurality of power amplifiers. The transmitter arrangement is configured to adapt a pre-distorting linearizer connected to a first input port of the precoder W, based on an obtained first signal $X_1$ and on a combination of signals from the plurality of antenna elements resulting from the propagation of $X_1$ via the precoder W, and via the plurality of power amplifiers.

According to a third aspect, a network node is provided, comprising a transmitter arrangement according to the second aspect.

According to a fourth aspect, a computer program is provided, comprising instructions which, when executed on at least one processor, cause the at least one processor to carry out the method according to the first aspect.

According to a fifth aspect, a carrier is provided, containing the computer program of the fourth aspect.

BRIEF DESCRIPTION OF DRAWINGS

The foregoing and other objects, features, and advantages of the technology disclosed herein will be apparent from the following more particular description of embodiments as illustrated in the accompanying drawings. The drawings are not necessarily to scale, emphasis instead being placed upon illustrating the principles of the technology disclosed herein.

FIGS. 5-7a are schematic diagrams of antenna arrangements according to exemplifying embodiments.

DETAILED DESCRIPTION

Figure 1A:
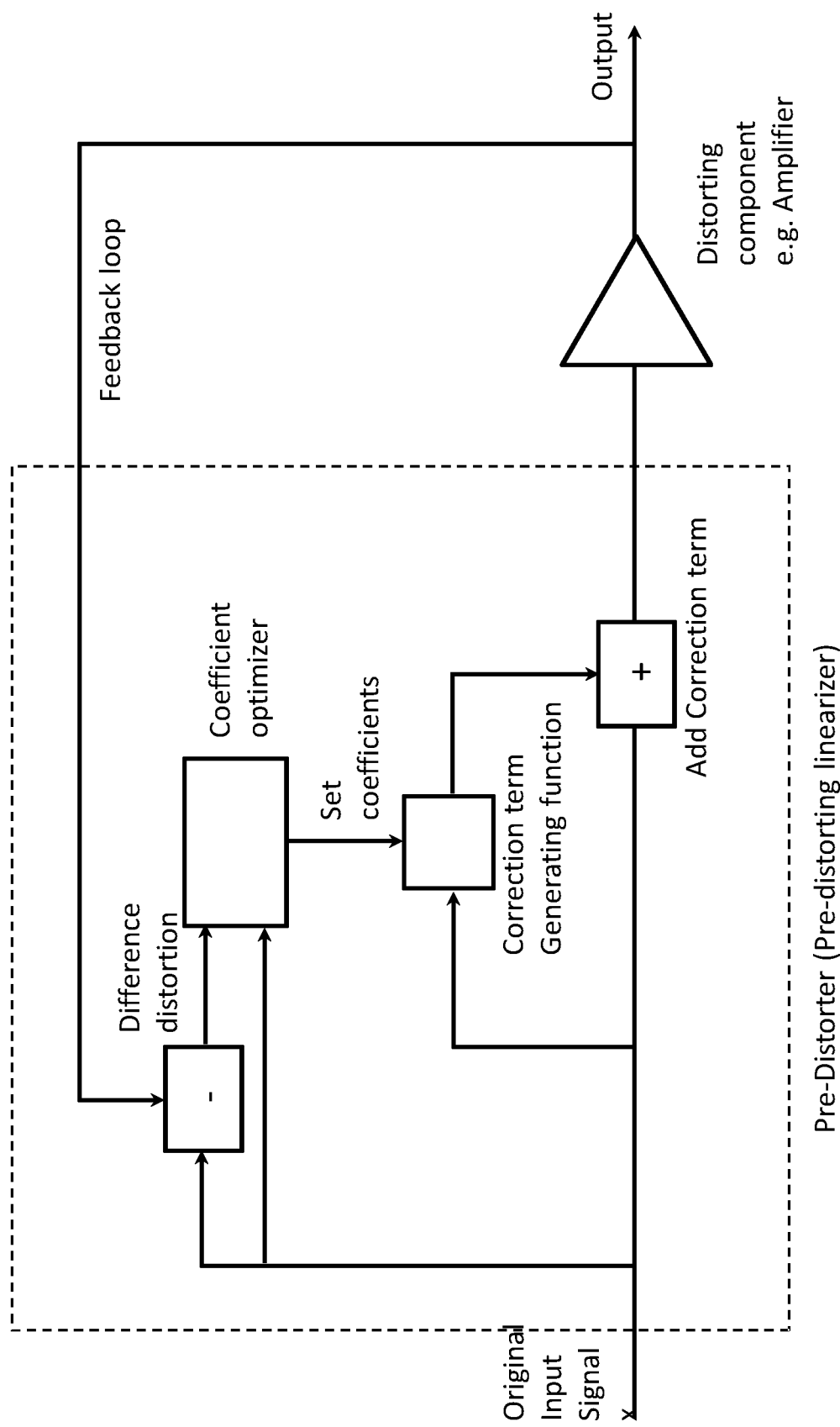
FIG. 1a is a schematic diagram of a pre-distorter according to the prior art.

FIG. 1a is a schematic block diagram illustrating an exemplifying pre-distorter according to the prior art. A pre-distorter works by adding correction terms to a signal, below referred to as the "original input signal", before it is input to a distorting component that is to be linearized. In FIG. 1a the distorting component is illustrated as a power amplifier. The correction terms are such that the resulting output from the power amplifier will be more similar to the original input signal than if the corrections terms had not been added. In the ideal case, the output signal from the distorting component will be the same as the input signal (but amplified in the case of a power amplifier), i.e. the pre-distorted signal which is input to the distorting component results in an output signal identical (but amplified in case of PA) to the original input signal. In other words, in the ideal case, all distortion caused by the distorting component is cancelled and the system is completely linear.

In order to determine the correction terms to be added to the original input signal, the output signal from the amplifier is fed back to the pre-distorter. The correction terms are continuously generated as a function of the original input signal; and the feedback signal is used to adapt this function, so as to minimize the difference between the feedback signal and the original input signal. For example, the correction term to be added could be generated as a polynomial of the original input signal and the coefficients of the polynomial adapted (e.g. by least squares) so as to minimize the difference.

e.g. $C = k_1 X^1 + k_2 X^2 + k_3 X^3 + \ldots$ where the coefficients k are adapted.

Today, the existing technology to linearize a manifold of active array antenna branches is to apply a linearizer to each one of the amplifiers in the array. Typically, the number of antenna branches is about 2-4, or possibly 8 branches. However, the number of active antenna branches in active antenna arrays is expected to increase at a fast pace, far beyond 8 antennas, in the future. It should also be noted that the number of active antenna branches may well, and is expected to, exceed the number of actual MIMO layers or beams being transmitted. When the antenna branches are as few as today, the applying of one linearizer per amplifier is a limited problem.

However, as the number of antenna branches increases, the large number of linearizers will become a problem, e.g. in terms of power consumption.

Figure 1B:
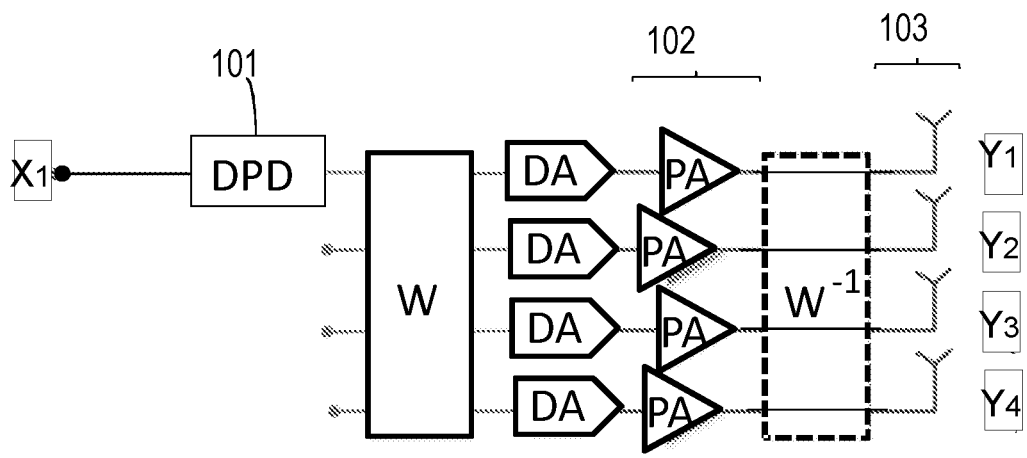
FIG. 1b is a schematic diagram of an antenna arrangement according to an exemplifying embodiment.

The inventors have realized a solution, which is described herein, according to which the number of linearizers used for linearizing a set of radio transceiver branches can be made considerably smaller than the number of radio transceiver branches in an active antenna system, AAS. For example, according to an embodiment of the solution, a single linearizer could be used for linearizing all the transceiver branches in an active antenna array. Alternatively, one linearizer per MIMO layer, or beam, could be used. FIG. 1b illustrates an antenna arrangement where a single port, or "single-channel" linearizer is used for linearizing a whole antenna array. An alternative to the above mentioned single linearizer would be to have two or more linearizers for a combination of baseband ports. A "one-per-MIMO-layer" option could be viewed as a version of the latter alternative. The solution will be further described below.

According to embodiments of the solution described herein, only one linearizer or, a limited number of linearizers, are used for linearizing a whole antenna array. This means that the number of linearizers may be considerably smaller than the number of parallel power amplifiers that are to be linearized. The linearized antenna array may be such that it is operable to provide so-called "massive MIMO", i.e. the invention is not limited to use only for a restricted number of antenna elements, e.g. as few as 2, 4 or 8, power amplifiers in parallel. According to one embodiment, an antenna array is linearized by use of a single linearizer placed just before the split baseband or signal power amplifiers. How this is done and why it is possible will be described in further detail below.

The use of one or a few linearizers is applicable in all cases, i.e. also when the power amplifiers in an active antenna array are all different in their non-linear characteristics. By applying embodiments described herein, a main or optimum decrease in unwanted emissions will occur in one or more desired directions, such as in the main lobe(s), or beam(s), of the linearized antenna array. In all other directions, there will still be some unwanted emissions radiated. The level of these unwanted emissions will be depending on the "likeness" of the non-linear properties of the power amplifiers. In the edge-case, where the amplifiers of an active antenna array are all equal in their non-linear properties, the same decrease in unwanted emissions could be expected in all directions of the antenna array angular space coverage.

Below, exemplifying method embodiments performed by a transmitter arrangement will be described. The method embodiments are suitable for linearization of an active antenna array. The active antenna array comprises a plurality of antenna elements, being associated with a plurality of power amplifiers. The active antenna array is further associated with a precoder, W, having a number of input and output ports. The transmitter arrangement may comprise the active antenna array, or the transmitter arrangement could be configured to be connectable to the active antenna array. The transmitter arrangement is further operable to be comprised in a network node in a wireless communication network supporting beam forming. For example, the transmitter arrangement could be comprised in a radio access node or other type of radio node or device, e.g. in a so-called Radio Equipment, RE, part of the node. FIG. 1b illustrates an exemplifying transmitter arrangement.

First, an embodiment will be described, which is applicable e.g. in a scenario where only one input port of the precoder W is to be fed with an input signal. This may also be referred to as that a single input port of the precoder is to be excited. Such a scenario where only one input port of the precoder W is to be excited may herein be referred to as a "single input port" scenario, "single-channel" scenario, or a "single input channel" scenario. A single-channel scenario is illustrated e.g. in FIG. 1b. Further below, an embodiment will be described, which is directed to a scenario where more than one input port of the precoder W is to be fed with a respective input signal. A scenario where more than one input port of the precoder W is to be excited may herein be referred to as a "multi-input port" scenario or a "multi-channel" scenario. A multi-channel scenario is illustrated e.g. in FIGS. 7a-7c.

Figure 2:
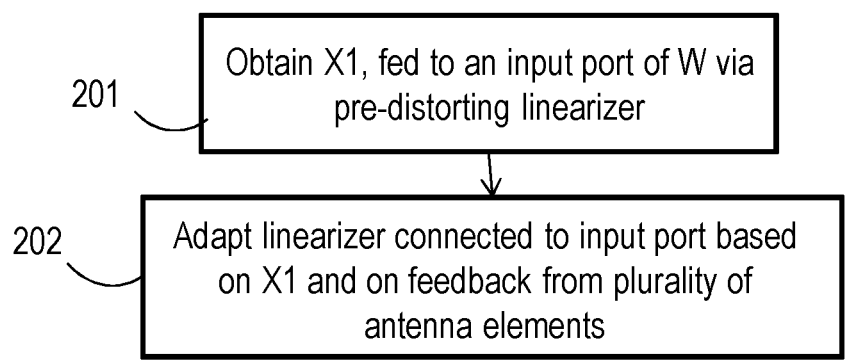
FIG. 2-3 are flow charts illustrating methods performed by a transmitter arrangement according to exemplifying embodiments.

A flow chart related to an exemplifying method embodiment is illustrated in FIG. 2. The method illustrated in FIG. 2 comprises adapting 202 a pre-distorting linearizer (a.k.a. pre-distorter) connected to a first input port of the precoder W, based on an obtained (201, 301) first signal $X_1$ and on a combination of signals from the plurality of antenna elements resulting from the propagation of $X_1$ via the precoder W, and via the plurality of power amplifiers.

The first signal $X_1$ is preferably obtained as appearing at the input of the pre-distorting linearizer. It could also be possible to obtain the signal at the output of the pre-distorting linearizer, before the precoder W. This is possible, since the pre-distortion applied to the signal by the linearizer is known. The most convenient alternative, however, would be obtaining the signal before the pre-distorting linearizer. The signal $X_1$ could be referred to as a desired signal, which it is desired that the combination of signals fed back from the plurality of antenna elements should resemble as far as possible. In the following, it will be assumed that $X_1$ is obtained as appearing at the input of the pre-distorting linearizer, even though there are at least one other alternative, i.e. after pre-distorting linearizer but before precoder W.

The first signal $X_1$, is a signal provided to the antenna array via the pre-distorting linearizer connected to the first input port of the precoder W. The signals from the plurality of antenna elements, and/or the combination thereof may also be referred to as "feedback" herein.

The precoder W could also be denoted e.g. pre-coding matrix, and may be assumed to process the signal $X_1$ such that it will be emitted in a certain radiation pattern. That is, a signal fed to an input port of the precoder W will be transmitted from a plurality, e.g. all of, of the antenna elements, such that a radiation pattern, such as a beam is created, in which the signal $X_1$ may be received e.g. by a wireless device. In case of beam forming, the radiation pattern will be a beam, and the precoder W may be referred to as a beam-former or beam-forming matrix. So-called "beams" are assumed to have a certain direction, i.e. a beam direction. The precoder W may be a so-called Butler matrix or a precoder as defined e.g. in 3GPP standards. The first signal $X_1$ is provided to the active antenna array via the pre-distorting linearizer and via an input port of W. The signal may be assumed to be output, in a processed form, on a plurality of outputs of the precoder W, and propagate to the antenna elements via the plurality of power amplifiers.

A pre-distorting linearizer connected to a first input port of a precoder W, is illustrated e.g. in FIG. 1b. The first input port need not necessarily be the "first", i.e. a certain one of the ports, but could be e.g. any one of the ports illustrated in FIG. 1b. The pre-distorting linearizer could be analogue or digital, but here we will assume that it is digital, e.g. a so-called Digital Pre-Distorter, DPD 101. The DPD 101 needs to be adapted in order to be able to pre-distort the signal $X_1$ such that unwanted emissions caused by non-linearities of the plurality of power amplifiers 102 of the active antenna array are mitigated, reduced or cancelled. In order to do this, information is fed back from the plurality of antenna elements 103 to the DPD 101. Either, only a selected part of interest of the signals could be fed back from the antenna elements, or, the part of interest could be derived e.g. by the DPD or an intermediate entity. The feedback is obtained by the antenna arrangement and is used, together with the obtained signal $X_1$, as base for adapting the DPD such that unwanted emissions are cancelled in a certain direction, e.g. in a beam direction associated with the first input port of W.

The feedback from the plurality of antenna elements could be related to signals transmitted in a certain direction from the antenna elements. In case unwanted emissions are to be minimized in a beam direction associated with the first input port, the feedback should be related to, or represent, a signal transmitted by the active antenna array in said beam direction.

The adaptation of the pre-distorting linearizer may be based on a measure, which is obtained based on feedback and the first signal $X_1$. The measure should reflect the unwanted emissions resulting from a combined non-linearity of the plurality of power amplifiers associated with the plurality of antenna elements. In other words, a measure may be obtained based on a combination of signals from the plurality of antenna elements and the signal $X_1$, which measure reflects the unwanted emissions, which are to be mitigated or cancelled by the DPD. The adaptation of the pre-distorting linearizer could then be performed based on said measure. The adaptation of the pre-distorting linearizer may further be described as being based on an obtained linear combination of non-linear intermodulation products resulting from the plurality of power amplifiers associated with the plurality of antenna elements.

The characteristic of the feedback signal could alternatively be understood as if there were a virtual summation port in the "air". In the text below, for facilitating understanding, a case where unwanted emissions are to be mitigated in a beam direction associated with the first input port of the precoder (beam-former) W, will be assumed. It should, however, be noted that the solution described herein also is applicable for minimizing unwanted emissions in other directions than the main beam directions. The virtual summation port is illustrated as a virtual "de-precoder" or "beam-de-former" $W^{-1}$ e.g. in FIG. 1b. The virtual de-precoder should represent performing the reverse of the precoder W, i.e. such that the signal $X_1$, including possible unwanted emissions would come out on an output-port corresponding to the first input port of W. It should be noted that the de-precoder $W^{-1}$ does not affect the signals propagating in the transmit branches of the active antenna array, but is only related to feedback. When designing $W^{-1}$ for minimizing unwanted emissions in a beam direction, a signal corresponding to the one that would come out at the output-port of $W^{-1}$ can be found if measuring a signal in the beam direction associated with the first input port of W. However, since it is not convenient to measure in a point in air, external to the antenna elements, the feedback is taken from each antenna element, or each branch. Direction will be derivable based on e.g. the phase of the signals transmitted from each antenna element. By a proper combination of signals from the plurality of antenna elements, by use of a function as $W^{-1}$, there is a way to mimic what happens in a certain beam direction.

The direction of a beam is indirectly known through knowledge of the precoder W, which may have an analog or digital form. It is not explicitly necessary to know the beam direction. It is sufficient to re-combine the output signals through a $W^{-1}$ multiplication. The matrix $W^{-1}$ may be derived from the precoder W, which is known. The DPD may then be adapted based the output of the matrix $W^{-1}$, which will be a combination, e.g. a sum, of the contribution from each antenna element in the direction of interest. In this case, the direction of interest is the beam direction associated with the first input port of the precoder W. The signal $X_1$ may thus be compared with the feedback signal, i.e. the output of the matrix $W^{-1}$. The DPD may be adapted accordingly, based on this comparison. In other words, the signals of the antenna elements in a direction, such as a beam direction, may be obtained by application of an appropriately configured matrix $W^{-1}$ on the output from the antenna elements.

By applying an embodiment of the method described above, an active antenna array can be linearized e.g. by a single pre-distorting linearizer, which is very beneficial e.g. for reasons as given above.

The method embodiment described above works well for adaptation of a linearizer when only one input port of the precoder W is excited, e.g. at a time. The linearizer described above may be referred to as "single-channel" linearizers, since the pre-distortion is based on one input signal ($X_1$) and feedback. However, when more than one input port of the precoder W is excited, another embodiment of the solution may be applied, which will be described below. Embodiments directed to scenarios where more than one input port of a precoder W are excited simultaneously, involves adaptation of another type of pre-distorting linearizer, different from the one used in the single-channel scenario described above.

When a plurality of input ports of a precoder W are to be excited, one linearizer per input port could be applied. Each input port of the precoder W is associated with a respective radiation pattern, such as a beam. In cases where an input port of the precoder is associated with a beam, the input port may also be referred to as a "beam port". By applying one pre-distorting linearizer per input port, unwanted emissions in a plurality of directions could be minimized. In case each excited input port of W is associated with a beam direction, unwanted emissions could be mitigated in each beam direction. The applying of one linearizer per input port, which is adapted according to an embodiment of the solution described herein, enables simultaneous mitigation of unwanted emissions in a plurality of directions, which is very beneficial. However, even though the unwanted emissions in a plurality of directions, e.g. beams, are mitigated or even cancelled, the unwanted emissions as radiated and integrated over the whole antenna array angular space coverage will be non-zero, although significantly reduced.

Below, an exemplifying method embodiment will be described with reference to FIG. 3. In this example, it is further clarified which additional features that may come in question for embodiments suitable for when two or more input ports of a precoder W are fed simultaneously (with respective signals $X_1$, $X_2$, . . . etc.) via pre-distorting linearizers.

Figure 3:
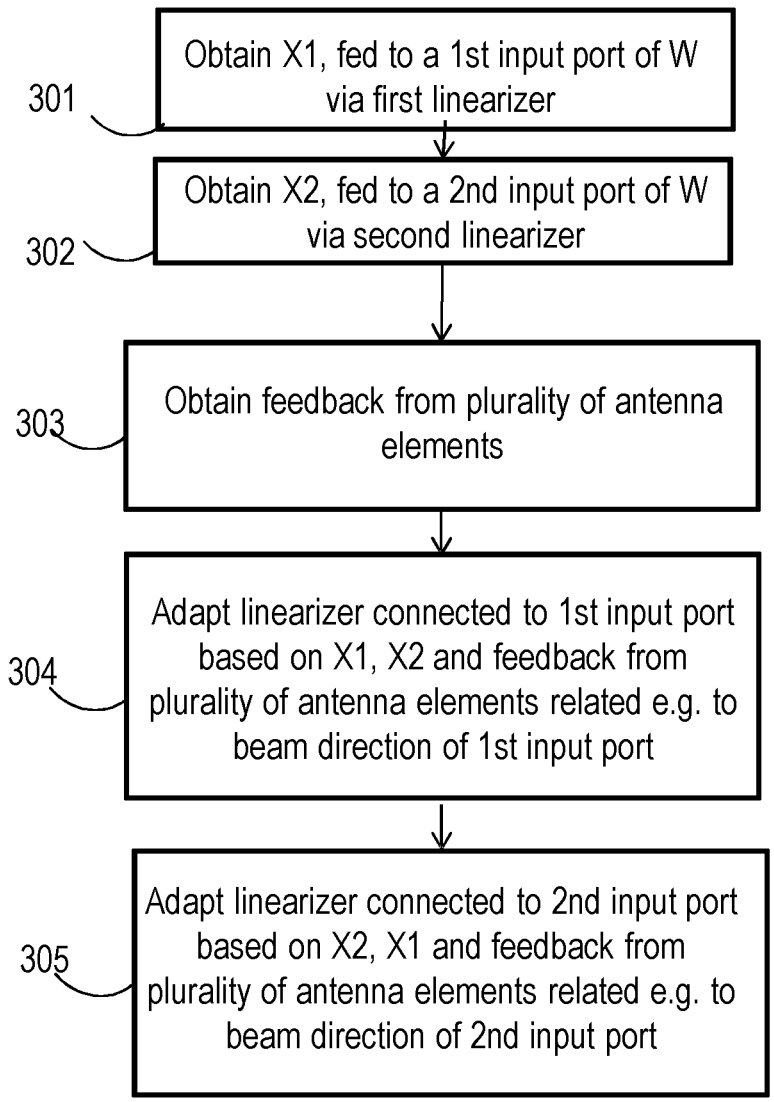

The method illustrated in FIG. 3 comprises obtaining 301 a first signal $X_1$ which is provided, or fed, to the antenna array via a pre-distorting linearizer connected to a first input port of the precoder W. The signal $X_1$ may be obtained as appearing at the input to the first pre-distorting linearizer. The method further comprises obtaining 302 a second signal $X_2$, which is simultaneously provided (simultaneously as the signal $X_1$ is provided to the antenna array) to the antenna array via a second pre-distorting linearizer connected to a second input port of the precoder W. The signal $X_2$ may be obtained as appearing at the input to the second pre-distorting linearizer. The signals $X_1$ and $X_2$ are fed simultaneously to the two ports, $X_1$ to the first input port (via the first linearizer), and $X_2$ to the second input port of W (via the second linearizer). The method further comprises obtaining 303 feedback of signals from the plurality of antenna elements. The method further comprises adapting 304 the pre-distorting linearizer connected to the first input port of W, based on the signal $X_1$ and the feedback, and also based on the signal $X_2$. The feedback, e.g. in form of a proper combination of signals from the plurality of antenna elements, will now also reflect the effect of the second signal $X_2$ on the signals from the plurality of antenna elements in a direction of interest, e.g. in a beam direction associated with the first input port. The feedback may then be compared to the signals $X_1$, $X_2$ and/or combinations thereof. In this way, unwanted emissions caused by non-linearities of the plurality of power amplifiers may be cancelled in a direction associated with the first input port of the precoder W, e.g. in a beam direction.

For cancellation of unwanted emissions also in a direction associated with the second input port of the precoder W during simultaneous excitation of the first and second input port, the method may further comprise adapting 305 a second pre-distorting linearizer connected to the second input port of W, based on the signal $X_1$, on the signal $X_2$ and based on feedback from the plurality of antenna elements in form of a combination of signals from the plurality of antenna elements resulting from the propagation of $X_1$ and $X_2$ via the precoder W, and via the plurality of power amplifiers. The combination of signals from the plurality of antenna elements should be related to a radiation pattern, or direction, associated with the second input port of the precoder W.

The pre-distorting linearizer connected to the first input port of the precoder W may be adapted based on an obtained, e.g. calculated, measure. Such a measure could be a linear combination of non-linear intermodulation products resulting from the plurality power amplifiers associated with the plurality of antenna elements. The measure may be calculated or derived based on the signals X1, X2 and on the feedback from the plurality of antenna elements. The signals $X_1$ and $X_2$, etc. may be pre-distorted by the respective adapted linearizers before being provided to the respective input ports of W, based on the obtained measure. This could be expressed as that the pre-distorting linearizers are adapted based on a measure of unwanted emissions resulting from a combined non-linearity of the plurality of power amplifiers. The signals from the plurality of antenna elements could be subjected to multiplication with a matrix $W^{-1}$, which may be derived e.g. as the inverse of the matrix W, to obtain feedback signals related to the directions of interest.

The internals of the pre-distorting linearizers may be implemented in different ways available to the skilled person, e.g. also in regard of handling memory effects and the like. In a single input channel pre-distorter, the applied pre-distortion will be a function of the input signal on that channel whereas in a multi-input-channel case, the applied pre-distortion on a particular channel will be a function of the input signals of several channels. In both cases the function for a channel will be adapted to minimize the difference between the input signal for that channel and the feedback signal used for that channel.

The embodiments above should be compared with the usual technique used today, which is to apply a respective Digital Pre-Distorter to each one of the antenna branches. This prior art technique also implies that there must exists a Digital-to-Analog converter, DAC, on each antenna branch. In simpler forms of active array antennas it may be desirable not to have any distributed DACs, i.e. a DAC per antenna branch, because of either cost reasons or heat dissipation reasons. In such cases it would not be even possible to apply a DPD on a per active branch level as in the prior art technique. Possibly, an analogue pre-distorter could have been applied on each antenna branch instead, but such analog linearizers have to date not shown as good performance as their digital counterparts. In addition, memory effect compensation would be very difficult to implement in an analog fashion.

Having all this said, it becomes even more interesting to have a linearizer on a common point and to keep with a digital linearizer (DPD) as according to embodiments of the solution described herein.

In order to understand why it would be possible to use e.g. only one linearizer to linearize a plurality of power amplifiers in parallel, these power amplifiers may be regarded as that they all together emulate a larger amplifier with basically the non-linear factors of the plurality of power amplifiers in parallel summed-up. An external linearizer applied at the input of the active array system cannot decide if internally, in the system, there is just one amplifier, or if there is a combination of amplifiers in parallel. The difference here lies in how the summation on the output side is made, i.e. which information that is fed back and used for adapting the linearizer, which will be described more thoroughly below. If the power amplifiers are all equal in terms of non-linearity, perfect IM (intermodulation) cancellation could, ideally, be achieved in all directions. When the amplifiers are un-equal in terms of non-linearity, perfect cancellation could, ideally, be achieved e.g. in the beam direction. In order to achieve perfect cancellation in all directions, it is required that there actually exists a physical summation point for the signals from all antenna branches, e.g. one point for all beams. In some cases, such a physical summation point may exist, but typically, such a "point" would be distributed in space.

If paralleling amplifiers within a black box having one input and one output, and applying a signal X to the input of the black box, the summation of the signals output from all the amplifiers in parallel would be done in the black box, and there would only be one output signal X'. The output of the black box could thus be denoted a summation port. However, if the output signal from each amplifier is kept separate, out from the black box and is radiated into the air, we would need to have a virtual summation port in the "air" instead to get the sum of the signals. In the air, this sum could only be found in a direction of "good" coherent combination of the signals in angular space. In other words, the sum could be found in a point in the main beam direction.

Note that regardless of the solutions, the spatial distribution of the unwanted emissions would not be beam-formed as the wanted or desired signal, and consequently the unwanted emissions will be spread in the angular domain.

Below, the concept of a virtual summation port will be explained in view of a few equations. Assume that the non-linear behavior of the power amplifiers may be characterized by a summation in the form of a summation of powers, i.e. a polynomial of the following form:

$$y(x) = \alpha_1 x + \alpha_2 x|x| + \alpha_3 x|x|^2 + \alpha_4 x|x|^3 + \quad (1)$$

We assume that the signal x is actually a function of time so that $x=x(t)$ in general, and that we can denote the Fourier transform of the same signal by $F\{x(t)\}=X(\omega)$.

Here, in Eq(1), we have for simplicity and without loss of generality dropped any other dependence to for example memory effects and so on, and just left a pure polynomial representation of the non-linear effect. Note that this exemplification is general enough to capture both so-called AM-AM distortion (gain compression or expansion distortion) as well as AM-PM distortion (phase distortion) in that the coefficients may be in general complex parameters.

Let further a manifold of amplifiers constitute excitation of an array antenna with each amplifier having different characteristics in regard of non-linearity. The combined output from this manifold would be as expressed in the following equation:

$$y(x) = \Sigma_{n=1}^{N} \alpha_{1,n} x + \alpha_{2,n} x|x| + \alpha_{3,n} x|x|^2 + \alpha_{4,n} x|x|^3 + \quad (2)$$

Or, expressed in another way, summing up all coefficients:

$$y(x) = x \Sigma_{n=1}^{N} \alpha_{1,n} + x|x| \Sigma_{n=1}^{N} \alpha_{2,n} + x|x|^2 \Sigma_{n=1}^{N} \alpha_{3,n} + x|x|^3 \Sigma_{n=1}^{N} \alpha_{4,n} + \quad (3)$$

Now, give the summed-up coefficients new parameter names according to:

$$\beta_1 = \Sigma_{n=1}^{N} \alpha_{1,n}, \beta_2 = \Sigma_{n=1}^{N} \alpha_{2,n}, \beta_3 = \Sigma_{n=1}^{N} \alpha_{3,n} \quad (4)$$

This in the end gives us the following representation of the combined manifold of parallel amplifiers:

$$y(x) = \beta_1 x + \beta_2 x|x| + \beta_3 x|x|^2 + \beta_4 x|x|^3 + \quad (5)$$

It may be noticed, that this is of the same form as Eq(1) above, but with new coefficients. That is, the combined amplifiers as seen when all the outputs were to be summed up in a combiner in a perfect, one-only, physical summation point.

A slightly different equation is obtained if the plane of summation is transferred outside the antenna array. For simplicity, we give this equation only for a uniform linear array (ULA), i.e. an array where the elements are placed along a straight line with equidistant placing of the antennas.

$$P(\Psi, \omega) = \Sigma_{m=1}^{M} PA_m(\omega) \cdot e^{-jk_0 m d \cdot \sin(\Psi)} \quad (6)$$

In the above equation, $k_0$ is the propagation constant in free space at the carrier frequency. The frequency parameter $\omega$ should be viewed as the frequency around the carrier such that it captures the spurious emissions.

$$PA_m(\omega)=\Sigma_{n=1}^{N}\alpha_{n,m}X_n(\omega) \quad (7)$$

where $$X_n(\omega)=F\{x(t)\cdot|x(t)|^{n-1}\} \quad F=\text{Fourier transform} \quad (8)$$

In view of Eq(6), we may look into what happens when amplifier excitations differ by a phase amount that makes the beam point in another bearing ($\Psi_0$) than at plain broadside direction. In that case, each amplifier input is phase adjusted by $e^{jk_0 md \cdot \sin(\Psi_0)}$. In this case the pattern diagram will obtain the following expression which is a modification of Eq (6).

$$P(\Psi,\Psi_0,\omega)=\Sigma_{m=1}^{M}PA_m(\omega)\cdot e^{-jk_0 md\cdot[\sin(\Psi)-\sin(\Psi_0)]} \quad (9)$$

Here, it can clearly be seen, that for the special case of $\Psi=\Psi_0$, i.e. the beam direction, we will have a pure summation of the different amplifier contribution when it comes to emissions; i.e.:

$$P(\Psi=\Psi_0,\Psi_0,\omega)=\Sigma_{m=1}^{M}PA_m(\omega) \quad (10)$$

If it would be desired, for some reason, to minimize the unwanted emissions in some other direction than the beam direction, i.e. for a case where $\Psi\neq\Psi_0$, the expression would instead be:

$$P(\Psi_1,\omega)=\Sigma_{m=1}^{M}PA_m(\omega)\cdot e^{-jk_0 md\cdot \sin(\Psi_1)} \quad (11)$$

Having said this, we can go further in our investigations as how to further control the linearization process when having less baseband ports than we actually have radio transmit ports. Observe that this does not limit in the definition of the number of baseband ports in relation to radio transmission paths and in the end, the actual number of antenna elements. Remember that we can also have a different number of physical antennas connected to each radio branch, which may in turn be a completely different number compared the baseband ports.

Figure 4A:
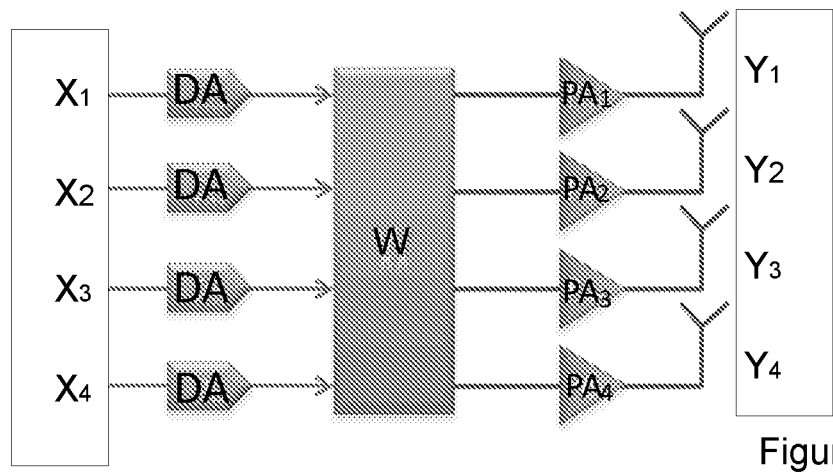
FIG. 4a-4d are schematic diagrams showing, for pedagogic reasons, modifications of a prior art antenna arrangement towards embodiments according to the invention.
Figure 4B:
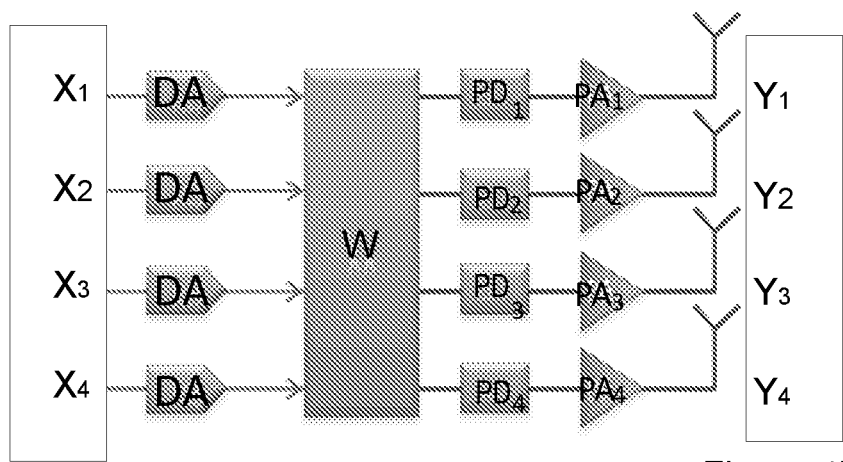

Consider the example depicted in FIG. 4a of four radio branches. It shows equally many input ports as we have antenna elements, but not yet any linearizers implemented. A straight forward way to linearize the array of amplifiers would be to place linearizers directly before each power amplifier (PA) as indicated in FIG. 4b.

In this case they are exemplified by Analog Pre-Distorters (APD), but may in general also be digital versions thereof.

Figure 4C:
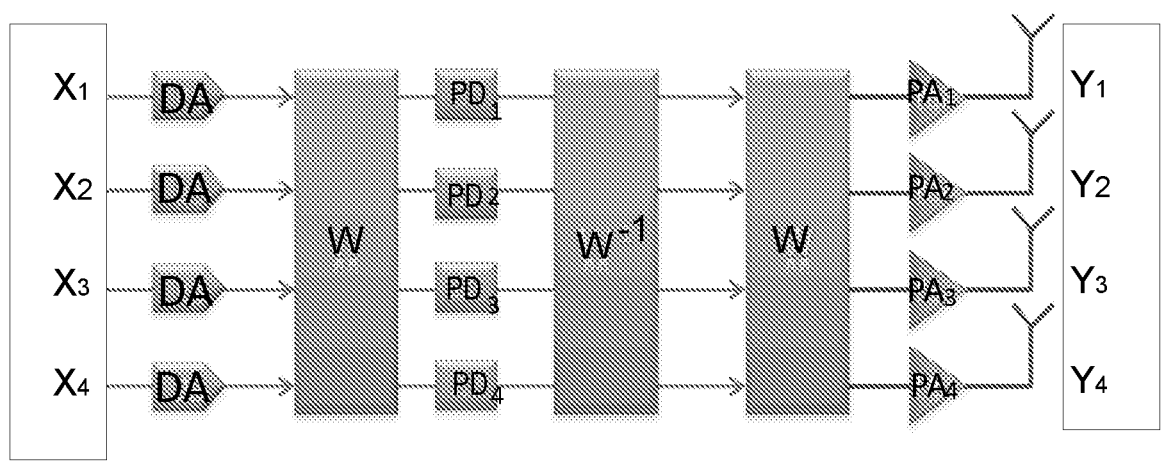
Figure 4D:
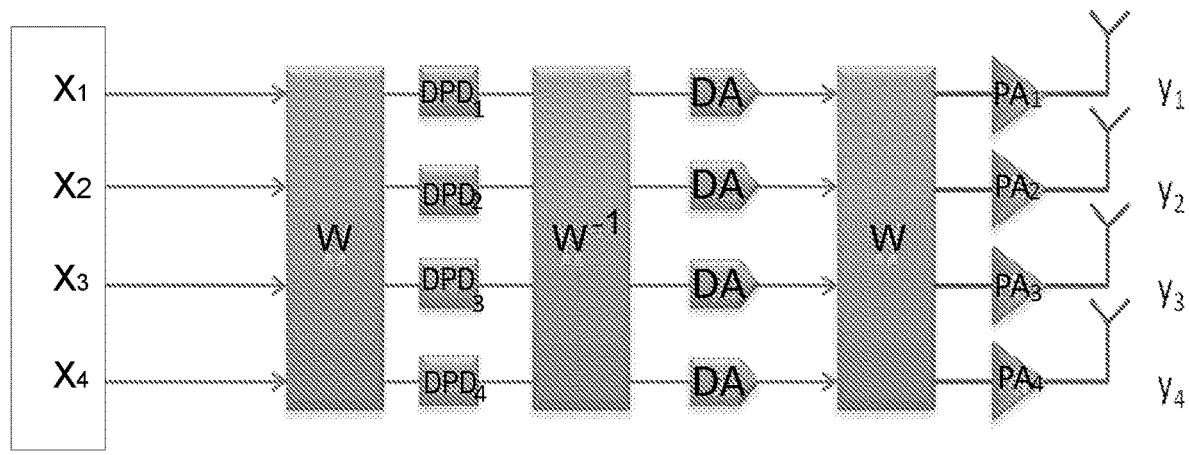

We may move forward in the analysis process of inserting the matrix product ($W^{-1}\times W$) between the PA array and the array of APD:s, as illustrated in FIG. 4c. Note that this will not change anything in the forward characteristics of the signal transmission path. In a further development we may also move the DAC array from the left of the system architecture to be placed right in the middle of this matrix product ($W^{-1}\times W$). This procedure is shown in FIG. 4d.

In doing so, we have effectively moved the linearizers to baseband and also allowed the linearizers to become digital. It should be noted that still every each one of the amplifiers are being individually linearized in this way. The matrix W could be referred to as a precoder, or beam former and could be implemented e.g. by a Butler matrix. It should also be remembered that the matrix W may also be viewed as being a precoder as defined in 3GPP for MIMO transmission. In other words, the matrix or precoder W can be e.g. a beam former or a MIMO precoder.

If we anticipate having so-called Port Expansion in the AAS, i.e. having fewer digital streams than the number of real antenna ports, then we may take another approach. We are only capable of linearizing as many ports as we have at digital baseband.

Let us go a step backwards now, by only considering one beam excitation. This would follow the picture as viewed in FIG. 5, which shows a single port excitation together with one-port only linearization.

Figure 5:
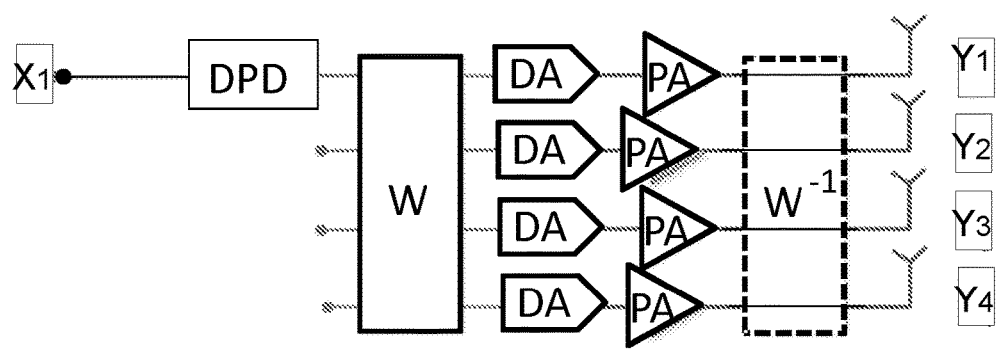
Figure 6:
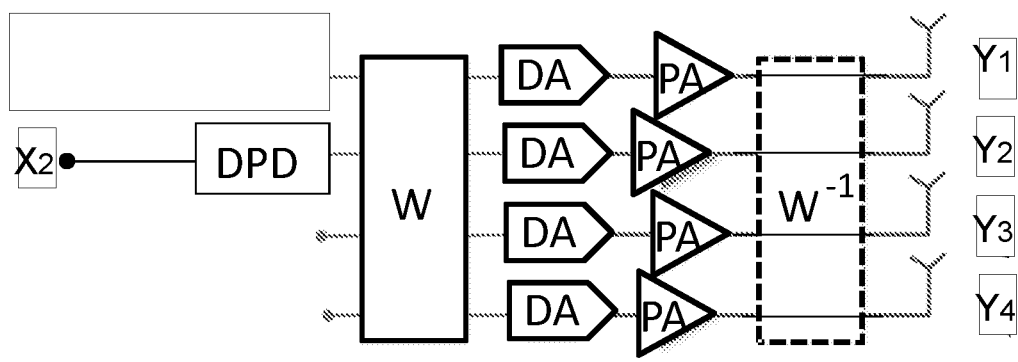

In view of the foregoing discussion, any port of the system depicted in FIG. 5 may be used for linearization and beam definition. In FIG. 6, the second port is excited by a signal that is supposed to be directed into a second beam, which, in general, is different than a beam created when exciting the first port, as illustrated in FIG. 5.

Again, in theory, perfect linearization may be obtained in any of the respective two input ports excited in FIGS. 5 and 6, and in the main direction of the corresponding beam. If the amplifiers are not perfectly identical, the resultant intermodulation, i.e. unwanted emissions, will still be at a minimum (if not zero) in the main beam direction, but a rest term will be present in other directions than the main beam. This statement holds for both cases depicted in FIG. 5 and FIG. 6, if the ports are excited separately. However, if the ports are excited at the same time, then the intermodulation (unwanted emissions) will not be completely cancelled even in the main direction of the two beams, since the signal contributions from the two beams will mix in a non-linear fashion.

Figure 7A:
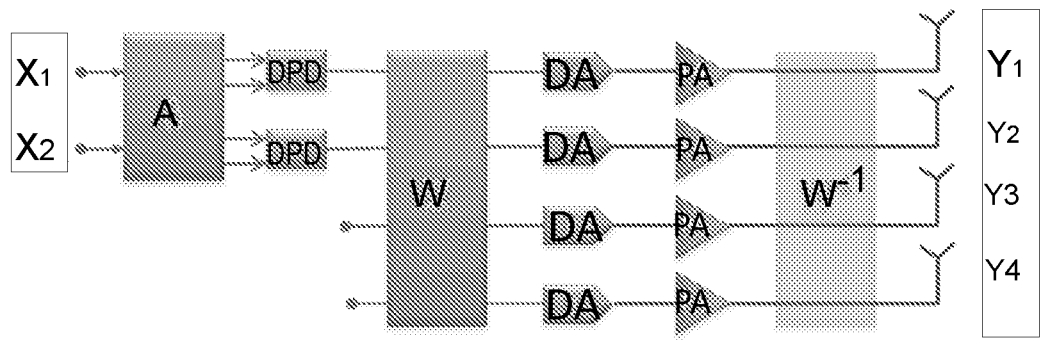
Figure 7B:
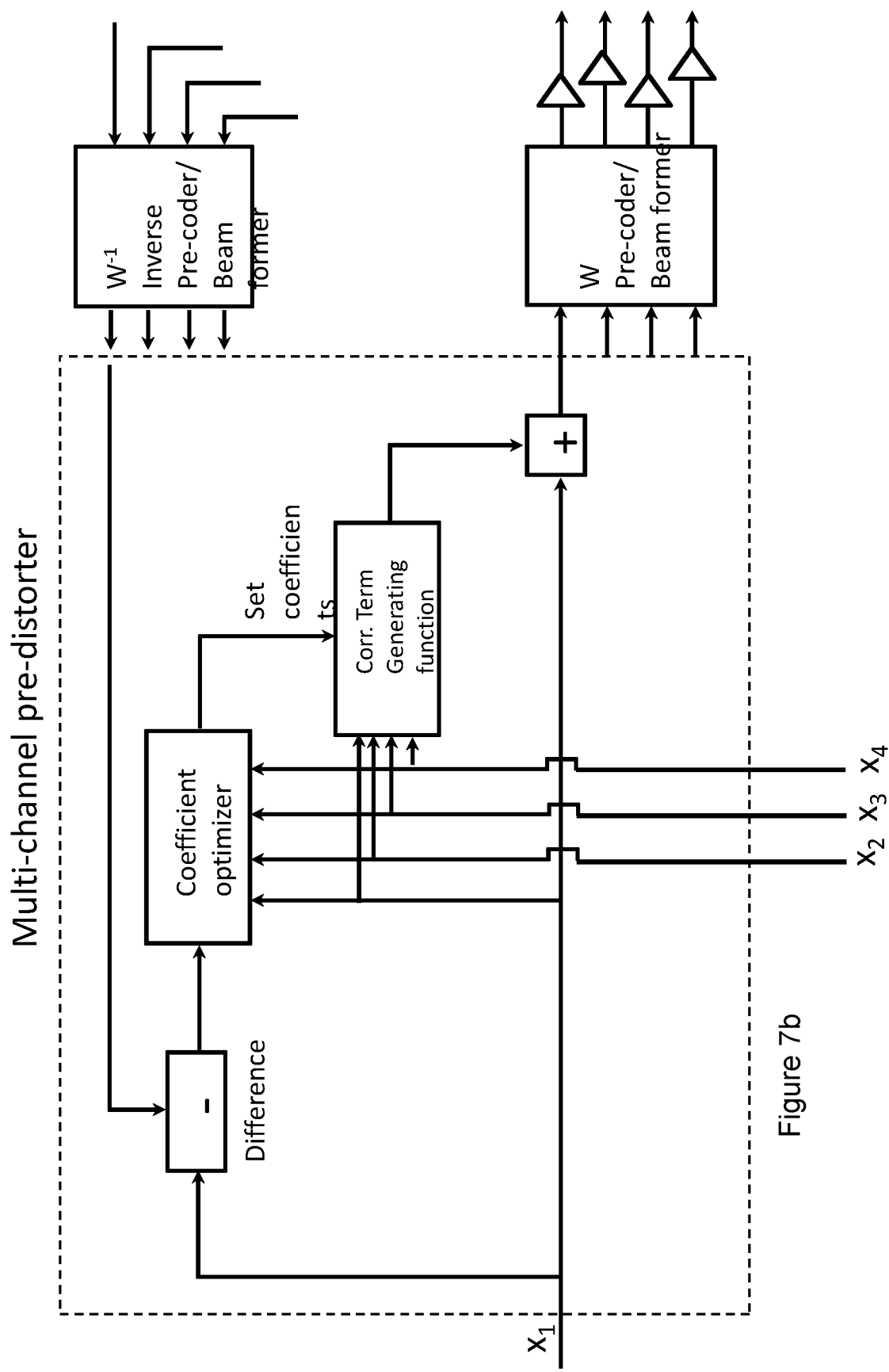
FIGS. 7b and 7c are schematic diagrams related to multi-channel pre-distorters, according to exemplifying embodiments.
Figure 7C:
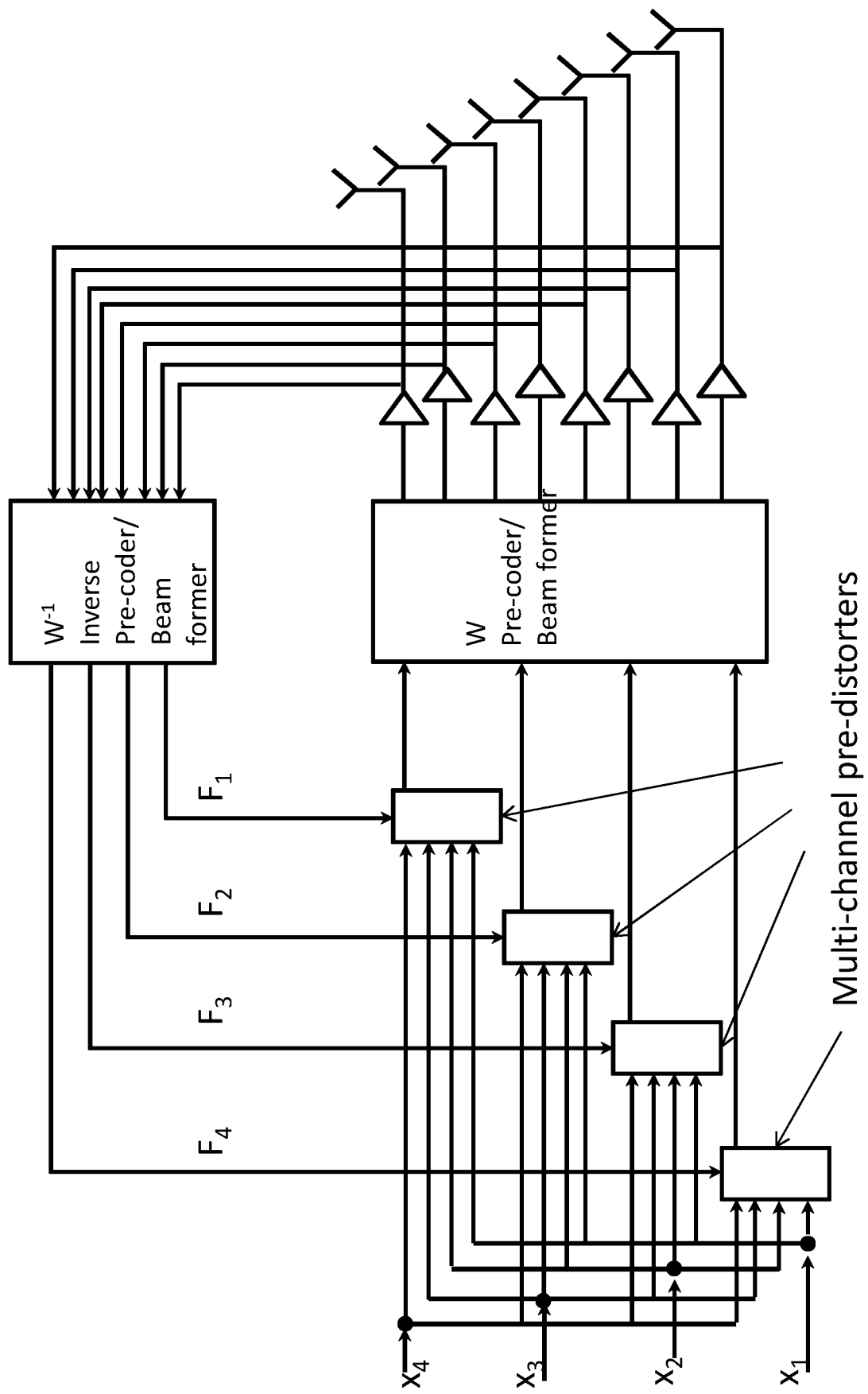

In order to keep the reduction of intermodulation (unwanted emissions) in the main beams also when two or more input ports are excited at the same time, we introduce a muxing matrix before the linearizers. It is assumed, for simplicity, that two ports are excited simultaneously, as illustrated in FIG. 7a. The muxing matrix is in this case a simple one, but will allow for defining cross-products between signals that will otherwise be introduced in the mixing of signals in the amplifiers.

The muxing matrix 'A' illustrated in FIG. 7a is of a very simple form, only copying and splitting the input to four output ports. In other words, the linearizers are provided with both input signals, i.e. both $X_1$ and $X_2$ in FIG. 7a. The matrix 'A' may be written as:

$$A=\begin{bmatrix}1 & 0\\0 & 1\\1 & 0\\0 & 1\end{bmatrix} \quad (12)$$

A pre-distorting linearizer taking a plurality of "precoder input signals", cf. $X_1$, $X_2$, $X_3$, etc, as input, apart from feedback, may be referred to as a multi-channel linearizer, or multi-branch linearizer. The use of a multi-channel or multi branch pre-distorting linearizer may be desired or needed in order to mitigate the distortion on a particular channel when affected not only by the signal on that channel, but by the signals of a plurality of channels that are used simultaneously. In such cases, the function for determining the correction term to be added in the multi-channel pre-distorter is not a function of (only) the input signal of the particular channel to be pre-distorted, but a function of the input signals of all channels. This function could e.g. be a polynomial and will be exemplified below.

A multi-channel or multi-branch linearizer may be formulated by considering a basic linearizer made up by a polynomial expansion where the argument is replaced by a sum of the branch signals. Let us say that a general linearizer follows the general formula according to below:

$$P(z)=\beta_0\cdot z+\beta_1\cdot z\cdot(|z|)^2+\beta_2\cdot z\cdot(|z|)^4+$$

Then by starting with a combination of just two antenna branch signals, we may make conclusion about the general case. So, let us start by formulating a combination of just two signals:

$$z=(a_1 \cdot x_1 + a_2 \cdot x_2)$$

Then, one expanded term in the polynomial series for the non-linearity would be:

$$z^{n+1} \cdot (\overline{n})^n = z \cdot (|z|)^{2 \cdot n}$$

Using further a binomial expansion series for a sum of variables, we may write down the following expression:

$$z^n = (a_1 \cdot x_1 + a_2 \cdot x_2)^n = \sum_{k_1=0}^{n} \left[ \frac{n!}{(n-k_1)! \cdot k_1!} \cdot (a_1 \cdot x_1)^{n-k_1} \cdot (a_2 \cdot x_2)^{k_1} \right]$$

And therefor also the following is true:

$$(\overline{z})^n = (\overline{a_1} \cdot \overline{x_1} + \overline{a_2} \cdot \overline{x_2})^n = \sum_{k_2=0}^{n} \left[ \frac{n!}{(n-k_2)! \cdot k_2!} \cdot (\overline{a_1} \cdot \overline{x_1})^{n-k_2} \cdot (\overline{a_2} \cdot \overline{x_2})^{k_2} \right]$$

And likewise we get:

$$z^{n+1} =$$

$$(a_1 \cdot x_1 + a_2 \cdot x_2)^{n+1} = \sum_{k_1=0}^{n+1} \left[ \frac{(n+1)!}{(n+1-k_1)! \cdot k_1!} \cdot (a_1 \cdot x_1)^{n+1-k_1} \cdot (a_2 \cdot x_2)^{k_1} \right]$$

Which in turn can be reduced to the following expression:

$$z^{n+1} \cdot (\overline{z})^n =$$

$$\sum_{k_1=0}^{n+1} \sum_{k_2=0}^{n} [c_{k_1,k_2} \cdot (a_1 \cdot x_1)^{n+1-k_1} \cdot (a_2 \cdot x_2)^{k_1} \cdot (\overline{a_1} \cdot \overline{x_1})^{n-k_2} \cdot (\overline{a_2} \cdot \overline{x_2})^{k_2}]$$

Going back to the general expression for the non-linear expansion of the pre-distorter we arrive at the following:

$$P(z) = \beta_0 \cdot z + \beta_1 \cdot z \cdot (|z|)^2 + \beta_2 \cdot z \cdot (|z|)^4 + \ldots$$

$$P(z) =$$

$$\beta_0 \cdot (a_1 \cdot x_1 + a_2 \cdot x_2) + \beta_1 \cdot \sum_{k_1=0}^{1+1} \sum_{k_2=0}^{1} [c_{k_1,k_2} \cdot (a_1 \cdot x_1)^{n+1-k_1} \cdot (a_2 \cdot x_2)^{k_1} \cdot$$

$$(\overline{a_1} \cdot \overline{x_1})^{n-k_2} \cdot (\overline{a_2} \cdot \overline{x_2})^{k_2}] + \ldots$$

$$\beta_2 \cdot \sum_{k_1=0}^{2+1} \sum_{k_2=0}^{2} [d_{k_1,k_2} \cdot (a_1 \cdot x_1)^{n+1-k_1} \cdot (a_2 \cdot x_2)^{k_1} \cdot (\overline{a_1} \cdot \overline{x_1})^{n-k_2} \cdot (\overline{a_2} \cdot \overline{x_2})^{k_2}]$$

So, by this example it is clear that in order to linearize a signal output that contains several base signals, we will also have to include those signals in the pre-distorter. We must include factors so as to accomplish all possible combinations of complex powers of the signal. That is, we will have to postulate that combinations such as the following are added:

$$x_1 \cdot (|x_1|)^2 \quad x_1 \cdot (|x_2|)^2 \quad x_2 \cdot (|x_2|)^2 \quad x_2 \cdot (|x_1|)^2$$

The above terms account for the third order non-linearity. If also the fifth order (or higher) is to be taken account for, then the same procedure has to be continued. The only difference is that the expressions become more complicated and that they will become numerous.

If more than two signals, that is Beam Port signals, have to be accounted for, the procedure is likewise as described above. The difference is only that one has to include all possible combinations of polynomial term products.

As a further example, if 3 precoder input port signals are present, we must include products of the following sort:

$$x_1 \cdot (|x_1|)^2 \quad x_2 \cdot (|x_2|)^2 \quad x_3 \cdot (|x_3|)^2$$

$$x_1 \cdot (|x_2|)^2 \quad x_1 \cdot (|x_3|)^2 \quad x_2 \cdot (|x_3|)^2 \quad x_2 \cdot (|x_1|)^2$$

$$x_1 \cdot \overline{x_2} \cdot x_3 \quad \overline{x_1} \cdot x_2 \cdot x_3 \quad x_1 \cdot x_2 \cdot \overline{x_3}$$

etc

We may identify the linear combination of needed terms by identifying possible products from the basic non-linear expansion already introduced by Eq1 at the beginning of this document. To simplify things without limiting the results, we only retain the 'odd' order terms in the expansion, such as:

$$y(x) = \alpha_1 x + \alpha_2 x |x|^2 + \alpha_4 x |x|^4 + \quad (13)$$

This representation may be re-written in a complex form in turn that lets us arrive at the following description:

$$y(x) = \alpha_1 x + \alpha_2 x^2 x^* + \alpha_4 x^4 x^* + \quad (14)$$

Let us now assume that the input signal 'x' above is actually a combination of two signals ($z_1$ and $z_2$), then the expansion would be in the form of the following, only indicating a few terms:

$$[z_1^3 z_1^{2*} z_1^3 z_1 {}^* z_2^{2*} z_1^2 z_2 z_1^{2*} z_1^2 z_2 z_1^{*} z_2^{*} z_1^2 z_2 z_2^{2*} \ldots$$
$$]=Z \quad (15)$$

The pre-distorter/linearizer would then include all of these possible combinations, so in a matrix form the output of each pre-distorter would be:

$$Z \cdot \gamma = DPD(z_1, z_2) \quad (16)$$

The cost function to minimize would be the beam output that is given by summing the array contributions, and weighting a sum according to the inverse of the matrix W. This virtual output matrix implementation is seen e.g. in FIG. 7a.

An iterative approach to solve for the linearization coefficients would be to update the two vector equations according to the following Least Mean Squares (LMS) algorithm:

$$\gamma_{1,k+1} = \gamma_{1,k} + \delta \cdot [Z_1^H Z_1]^{-1} Z_1^H \cdot (z_1 - q_1)$$

$$\gamma_{2,k+1} = \gamma_{2,k} + \delta \cdot [Z_2^H Z_2]^{-1} Z_2^H \cdot (z_2 - q_2) \quad (17)$$

where $q_1$ and $q_2$ are the beam column vectors taken from the signal matrix Q as the inverse of the beam matrix W is applied to the output ports $y_1$-$y_4$ (in this case). Also, $Z^H$ denotes the conjugate transpose matrix. That is:

$$Q = Y \cdot W^{-1} \quad (18)$$

Although it would be required to have all the PA's equal in all aspects of linearity to get full intermodulation cancellation in all angles, one will in fact get a substantial reduction even if the correlation between PAs is not 100%. Also, with a slight difference between PAs, the linearization of the integrated power over the radiating sphere will go down. This slight difference between PA non-linearity we might call correlation.

In fact, in order to assess the improvement, it is possible to actually manually integrate the radiated power in the special case of the array being a Uniform Linear Array antenna (ULA) to get a closed expression for it.

We may start with a general expression for the total power over frequency that is radiated by the ULA by using Eq11 above:

$$P(\omega) = \int_0^\pi \int_0^\pi |\Sigma_{m=1}^M PA_m(\omega) \cdot e^{-jk_0 md \cdot \cos(\theta)}|^2 \sin(\theta) d\theta d\varphi \quad (19)$$

For a ULA, and after simple $\varphi$-integration, this series can be integrated term-by-term to yield the following form:

$$P(\omega) = \pi \cdot \int_0^\pi \left|\sum_{m=1}^M PA_m(\omega) \cdot e^{-jk_0 md \cdot \cos(\theta)}\right|^2 \sin(\theta) d\theta = = \quad (20)$$

$$\pi \int_0^\pi \left(\sum_{n=1}^N PA_m(\omega) \cdot e^{-jk_0 nd \cdot \cos(\theta)}\right) \cdot$$

$$\left(\sum_{m=1}^N PA_m(\omega) \cdot e^{-jk_0 md \cdot \cos(\theta)}\right)^* \sin(\theta) d\theta$$

After interchanging the order of integration and summation, we obtain the following:

$$P(\omega) = \pi \sum_{n=1}^N \sum_{m=1}^N [PA(\omega)_n PA(\omega)_m^*] \cdot \int_0^\pi e^{(m-n)2\pi \cdot d \cdot \cos(\theta)} \sin(\theta) d\theta = = \quad (21)$$

$$\pi \sum_{n=1}^N \sum_{m=1}^N [PA(\omega)_n PA(\omega)_m^*] \cdot \frac{\sin[2 \cdot \pi d(n-m)]}{[\pi d(n-m)]}$$

This last expression (21) lets itself be used to predict the integrated power over the whole sphere of radiation range, also as a function of frequency. Further as a special case, in the above formula, it should be observed that if d=0.5 ($\lambda$), then the summation only gives result if n=m, that is, for this special case, the result will be:

$$P(\omega, d=0.5) = 2\pi \cdot \Sigma_{n=1}^N |PA(\omega)_n|^2 \quad (22)$$

The above result shows the integrated power spectrum from an ULA when the inter-element distance is 0.5$\lambda$ which may be seen as a limitation, but more clearly shows the behavior of the emissions from an array antenna.

This expression can be used to evaluate pre-distortion of all antenna elements by one only common DPD working on all of the amplifiers. As an example, the above expression may be numerically computed for different similarities between PAs expressed as correlation between non-linear PA-coefficient vectors.

The correlation used herein is defined by the following expression:

$$\text{Corr}(\alpha, \beta) = \frac{\alpha \cdot \beta^*}{|\alpha||\beta|} \quad (23)$$

Where we might refer the two vectors $\alpha$ and $\beta$ being the coefficients in the non-linear polynomial expansion of the PA response, as:

$$PA(x, \alpha) = \sum_{n=0}^{N-1} \alpha_n \cdot x|x|^n \quad (24)$$

$$PA(x, \beta) = \sum_{n=0}^{N-1} \beta_n \cdot x|x|^n \quad (25)$$

Figure 8:
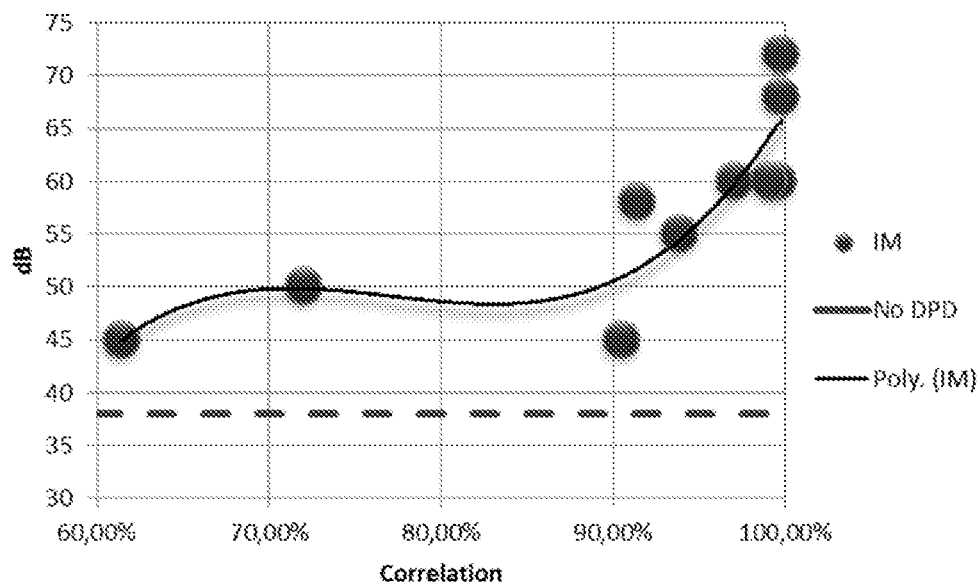
FIG. 8 is a graph showing an ACLR as a function of the correlation between amplifiers for a 4-element ULA.

In the correlation expression, we have included indexes from 1 to N−1, where we assume the first coefficient to be aligned between amplifiers and being set to $\alpha_0 = \beta_0 = 1.0$ An example demonstrating improvement of the integrated emissions over the full sphere is shown by the graph in FIG. 8 showing Adjacent Channel Leakage Ratio (ACLR) as a function of the correlation between amplifiers.

This example shows that even if the correlation between amplifiers is not 100%, we might actually considerably gain in InterModulation, IM, suppression, i.e. suppression of unwanted emissions, by implementing one single DPD/linearizer for all amplifiers. The graph in FIG. 8 shows an example for a 4-element ULA with an amplifier on each of the antenna branches where two beams have been excited for the array antenna.

For example, it can be seen from the graph in FIG. 8, that without any linearization (bold/dashed line), the IM-level will be at 38 dB for this example. It can also be seen that, when applying an embodiment of the solution described herein, even with only 60% correlation between amplifiers, the IM-level may be reduced to actually 45 dBc. This level may be compared with what is stated in the LTE specification in 3GPP which indicates a level of 45 dBc for the ACLR. So, this simple example shows that considerable improvement can be made in the ACLR by using an embodiment described herein, also when all amplifiers are not equal in their linearity characteristics.

Figure 9:
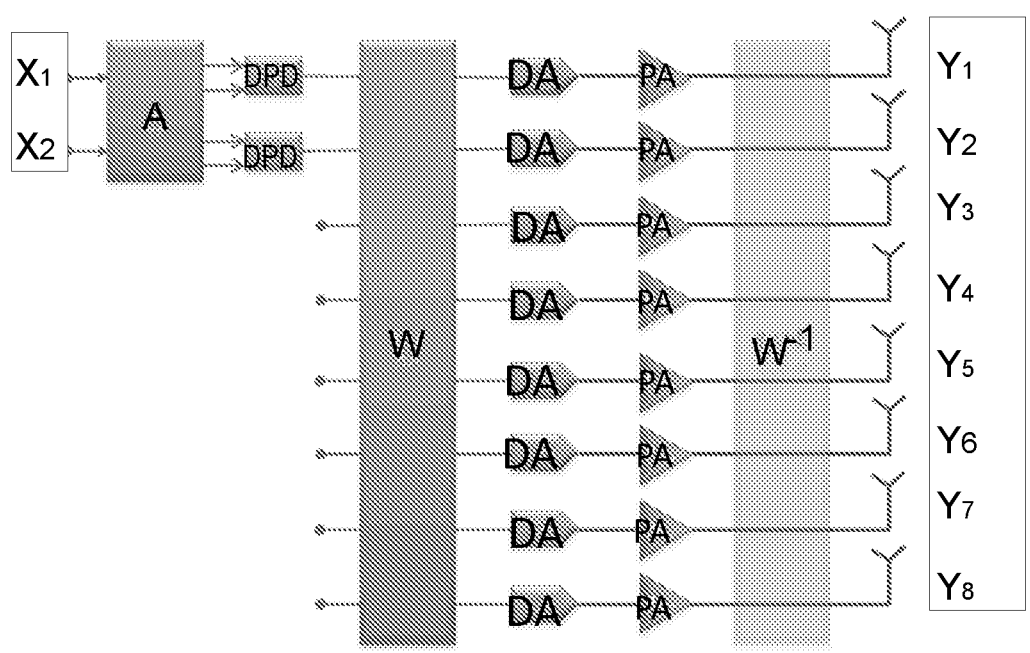
FIG. 9 shows dual input port excitation of an antenna arrangement comprising an 8-element ULA, according to an exemplifying embodiment.

As a specific example, we will demonstrate the technique by linearizing two input ports of an array antenna that comprises 8 antenna elements, as the one illustrated in FIG. 9. For simplicity we assume those elements to radiate in an isotropic way. The beam patterns are obtained from simple FFT-like excitation vectors.

Figure 10A:
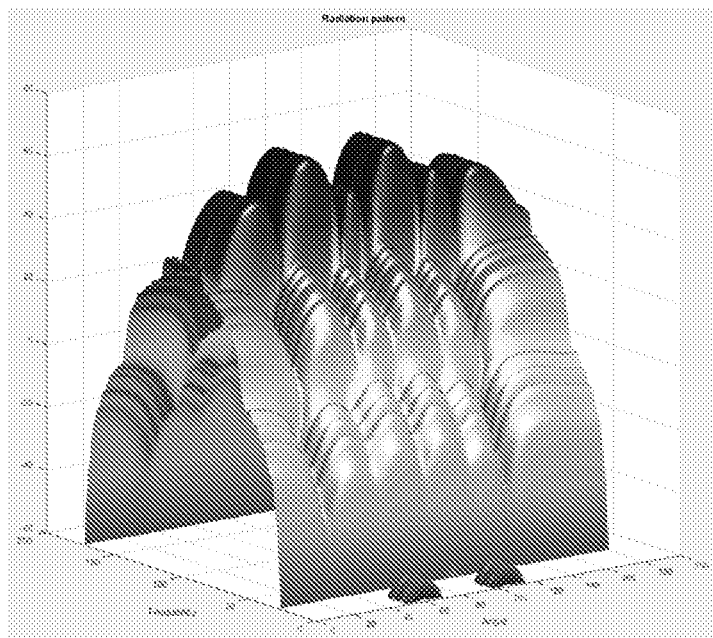
FIGS. 10a-c are graphs illustrating radiation patterns for an exemplifying 8-element ULA when not applying the invention (10a), and when applying an exemplifying embodiment of the invention (10b) and a comparison between the two in another graph representation (10c).

The diagram in FIG. 10a shows a combined angular-spectral diagram for this 8-element array. It shows the radiation pattern for both the main carrier beam(s) and also the radiation pattern from the emissions. As this depicts the radiation scenario for a ULA the "phi"-direction will observe omni radiation and therefore we may use the second coordinate axis of the 3D graph to depict the spectral distribution instead. In the diagram in FIG. 10a, each DPD/linearizer (of the two) is in its initial state and has not started its iteration yet. In other words, FIG. 10a shows an example of a radiation pattern as function of both frequency and angle for an example 8-element ULA, as the one illustrated in FIG. 9, where the PA correlation is 73% and no DPD is activated.

Figure 10B:
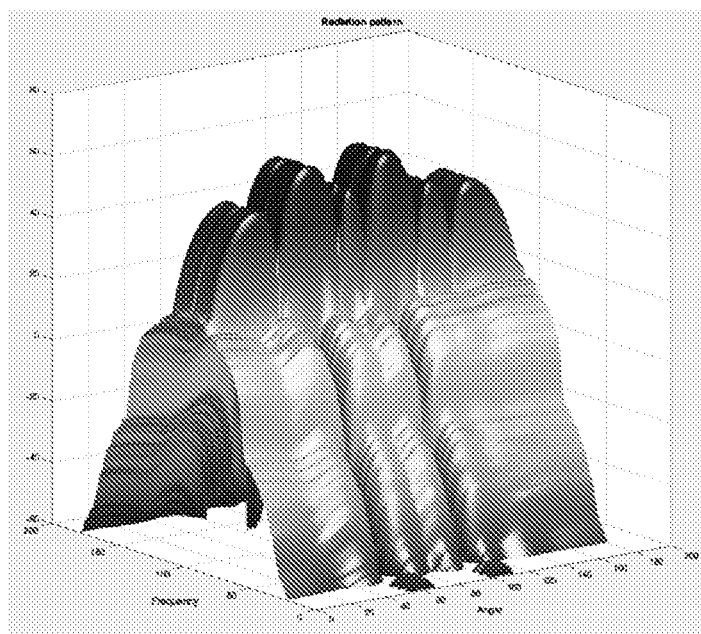

In FIG. 10b a corresponding radiation pattern can be seen for the exemplifying 8-element ULA when the DPD has converged. As can be seen in FIG. 10b, the intermodulation has significantly been reduced as integrated over the sphere, and deep spectrum nulls have formed in the two main beam directions. The result can be compared with the radiated emission as presented in FIG. 10a. In this specific case, each individual amplifier has been given a specific non-linear characteristic as to mimic a certain non-unity correlation between amplifiers. In this case the correlation has been set to 73%.

Figure 10C:
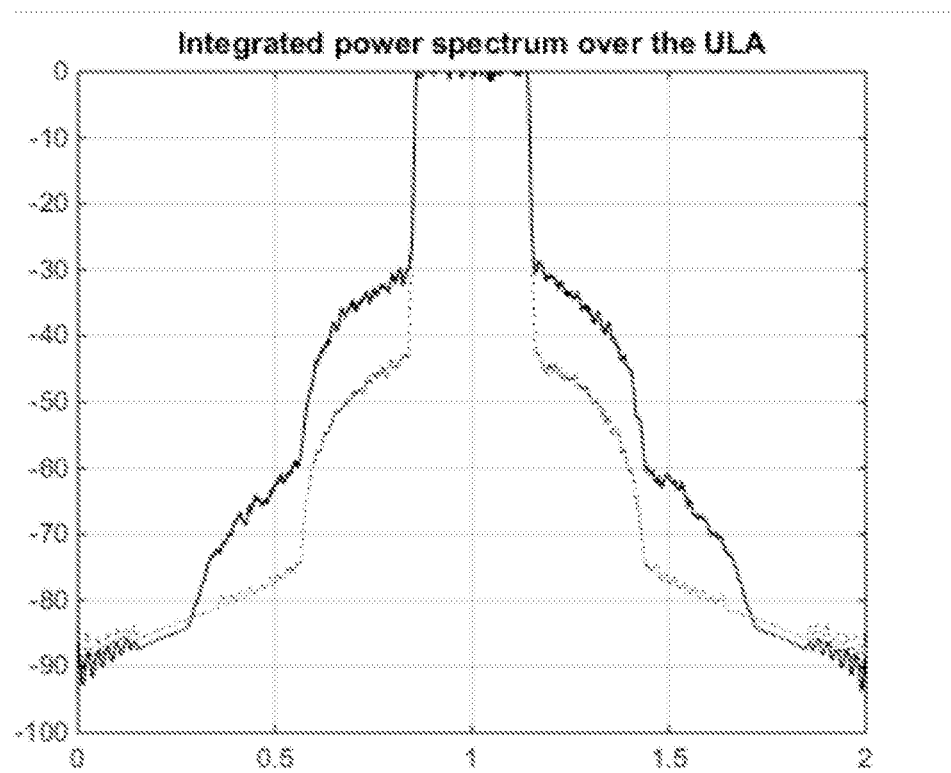

Although the correlation is as low as 73% in this example, the reduction in integrated emissions over the sphere is significant. In FIG. 10c, the spectrum diagrams for the integrated spectrum may be compared. The solid, more bold appearing line represents the case without port DPD, and the dotted, thinner appearing line represents the case with dual port DPD/linearizing.

Although in the limited case where the correlation between amplifiers is very low and very little reduction in ACLR can be obtained as integrated over the whole sphere, there will be considerable reduction in the emissions into the main beam. In specific cases where a high order modulation scheme is used, e.g. 256-QAM, it would be required to have a very low EVM of about 3%. This leads to that emissions also in the main beam is important to keep low. Calculations give that 3% EVM corresponds to an emissions level of −30 dB below main carrier. So clearly in that case, any reduction of emissions even towards one's own served UE would be appreciated.

The method embodiments and techniques described above may be implemented in a wireless communication network, e.g. in transmitter arrangements, which may be comprised in one or more network nodes, such as e.g. radio access nodes, such as eNBs. The methods could be implemented in a distributed manner, e.g. a plurality of nodes or entities could each perform a part of the actions e.g. at different locations in the network. For example, one or more embodiments could be implemented in a so-called cloud solution, or a "Centralized RAN" or "Split Architecture", where e.g. an eNB is divided into 2 or more separate nodes. Correspondingly, the network could be configured such that actions of the method embodiments are performed e.g. partly in a radio access node and partly in a core network node. The distributed case could be described as that the method is performed by a transmitter arrangement or a network node operable in the communication network, but that the transmitter arrangement or the network node could be distributed in the network, and not necessarily be comprised in one physical unit e.g. close to an antenna. Examples of distributed and non-distributed implementations will be given further below, with reference to FIGS. 12 and 13.

Figure 11A:
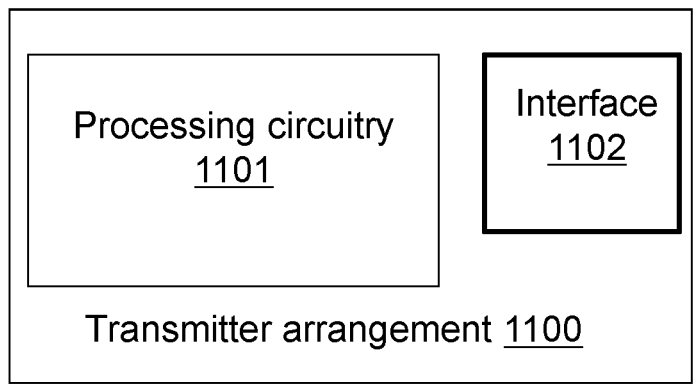
FIGS. 11a-c are schematic block diagrams illustrating different implementations of an antenna arrangement according to exemplifying embodiments.

An exemplifying embodiment of a transmitter arrangement is illustrated in a general manner in FIG. 11a. The transmitter arrangement 1100 is configured to perform at least one of the method embodiments described above, e.g. with reference to FIG. 2 or 3. The transmitter arrangement 1100 is associated with the same technical features, objects and advantages as the previously described method embodiments. The transmitter arrangement will be described in brief in order to avoid unnecessary repetition.

The transmitter arrangement may be implemented and/or described as follows: The transmitter arrangement 1100 comprises processing circuitry 1101, and one or more communication interfaces 1102. The antenna arrangement is configured for linearization of an active antenna array, which is associated with a plurality of antenna elements and a plurality of power amplifiers. The active antenna array is further associated with a precoder, W, having a number of input and output ports. The transmitter arrangement may or may not be defined as comprising the actual antenna array or antenna elements, power amplifiers, linearizer etc. In the case the transmitter arrangement is defined as not comprising the antenna array and/or the associated components, the transmitter arrangement is at least connectable to the antenna array to be linearized, including the relevant components. The processing circuitry may be composed of one or more parts which may be comprised in one or more nodes in the communication network, but is here illustrated as one entity.

The processing circuitry 1101 is configured to cause the transmitter arrangement 1100 to adapt a pre-distorting linearizer connected to a first input port of the precoder W, based on an obtained first signal $X_1$ and on a combination of signals from the plurality of antenna elements resulting from the propagation of $X_1$ via the precoder W, and via the plurality of power amplifiers. The one or more communication interfaces 1102, which may also be denoted e.g. Input/Output (I/O) interfaces, may include an interface for obtaining signals and information from one or more other entities.

Figure 11B:
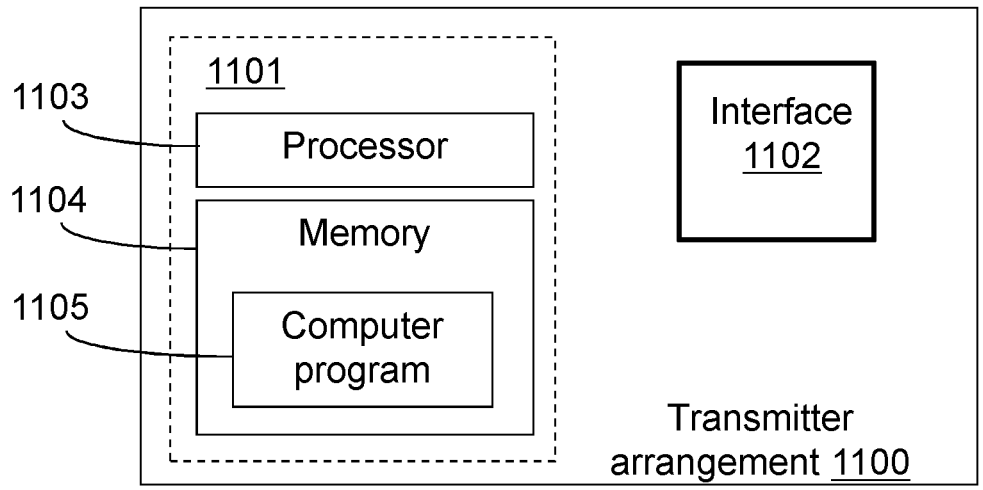

The processing circuitry 1101 could, as illustrated in FIG. 11b, comprise one or more processing means, such as a processor 1103, and a memory 1104 for storing or holding instructions. The memory would then comprise instructions, e.g. in form of a computer program 1105, which when executed by the one or more processing means 903 causes the network node or arrangement 1100 to perform the actions described above. The processing circuitry 1101 may, be composed of one or more parts and be comprised in, or distributed over, one or more nodes in the communication network as illustrated in FIGS. 10 and 11, but is here illustrated as one entity.

Figure 11C:
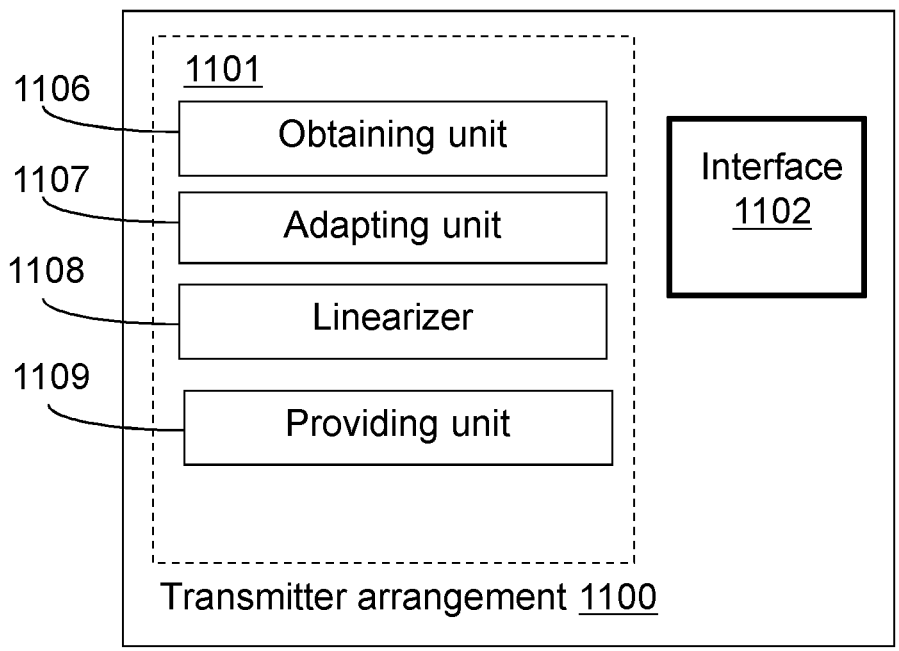

An alternative implementation of the processing circuitry 1101 is shown in FIG. 11c. The processing circuitry comprises an adapting unit 1107, configured to cause the transmitter arrangement to adapt a pre-distorting linearizer connected to a first input port of the precoder W, based on an obtained first signal $X_1$ and on a combination of signals from the plurality of antenna elements resulting from the propagation of $X_1$ via the precoder W, and via the plurality of power amplifiers. The processing circuitry may further comprise an obtaining unit 1106, configured to cause the network node or arrangement to obtain the signal $X_1$ and feedback from antenna elements of the active antenna array. The processing circuitry may further comprise the actual linearizer(s) to be adapted 1108. The processing circuitry could comprise more units, such as e.g. another obtaining unit 1109 for obtaining e.g. a signal $X_2$, fed to a second input port of W, which then also may be used as base for adapting the linearizer. The processing circuitry 1101 may, as previously mentioned be comprised in, or distributed over, one or more nodes in the communication network, but is here illustrated as comprised in one entity. The network nodes and arrangements described above could be configured for the different method embodiments described herein.

Figure 12:
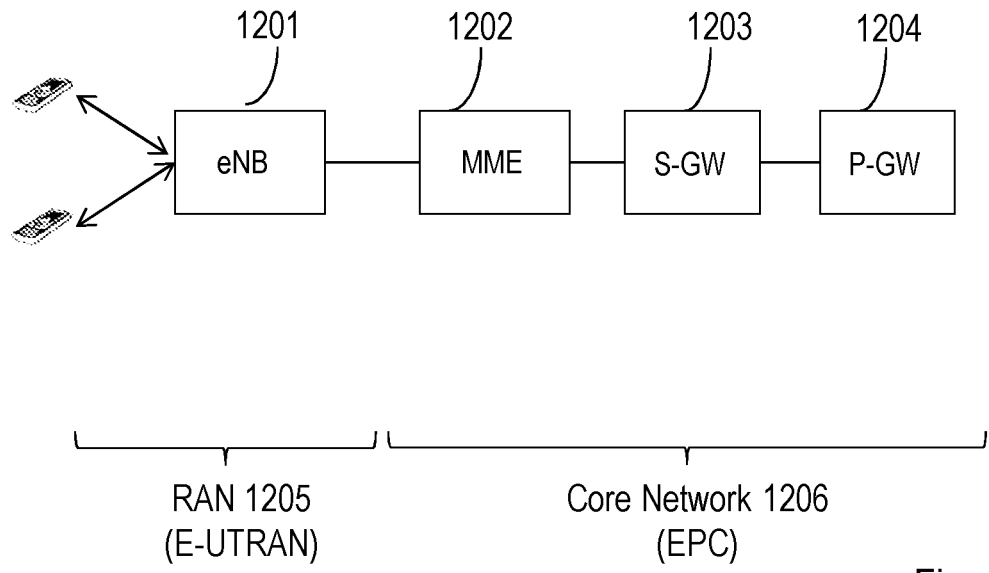
FIGS. 12-13 are schematic block diagrams illustrating different implementations of a wireless communication network, in which embodiments may be applied in a distributed or non-distributed manner.

FIG. 12 illustrates an exemplifying wireless communication network, in this case an LTE network, in which embodiments of the herein suggested solution may be implemented and applied. Wireless communication networks are often described in terms of a Radio Access Network, RAN 1005, and a Core network 1006. In LTE these are denoted E-UTRAN and EPC. The E-UTRAN 1005 comprises radio access nodes 1001, which are denoted eNBs. The EPC 1006 comprises core network nodes such as MME 1002, S-GW 1003 and P-GW 1004. The embodiments described herein could be implemented in one or more nodes in a network. For example, in the exemplifying network illustrated in FIG. 12, the functionality for performing the embodiments described herein could be implemented in the radio access node 1201, which would then adapt a pre-distorting linearizer connected to the first input port based on an obtained signal $X_1$ and a combination of signals from the plurality of antenna elements resulting from the propagation of the signal $X_1$ via the precoder W, and via the plurality of power amplifiers. Alternatively, the functionality could, at least partly be implemented in a core network node, such as the MME 1002 or some other control node.

Figure 13:
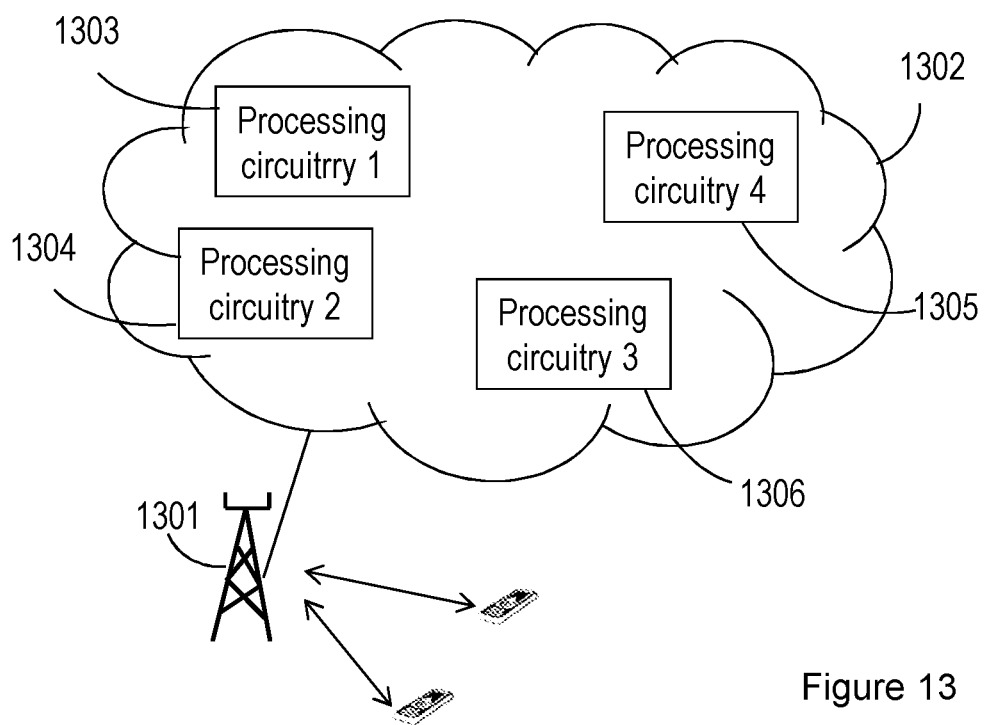

FIG. 13 also illustrates an exemplifying wireless communication network, in which embodiments suggested herein may be implemented. FIG. 13 intends to illustrate a so-called cloud solution, where resources e.g. in form of cloud entities comprising processing capacity or processing circuitry 1303-1306, in different locations may be used for implementing a certain functionality. The resources need not necessarily be located close to the antenna or access node 1301, but may be located in another country. Such resources may be owned by the network provider or operator, or may be provided or rented from a third party. In this type of solution, the functionality associated with a radio access node, e.g. such as the node 1201 in FIG. 12, could be implemented in one or more servers or entities located different geographic positions. In regard of embodiments of the solution described herein, the functionality could be implemented in one or more of cloud entities 1303-1306. The functionality could be implemented as a cooperation between cloud entities. This is an example of a distributed solution.

The steps, functions, procedures, modules, units and/or blocks described herein may be implemented in hardware using any conventional technology, such as discrete circuit or integrated circuit technology, including both general-purpose electronic circuitry and application-specific circuitry.

Particular examples include one or more suitably configured digital signal processors and other known electronic circuits, e.g. discrete logic gates interconnected to perform a specialized function, or Application Specific Integrated Circuits (ASICs).

Alternatively, at least some of the steps, functions, procedures, modules, units and/or blocks described above may be implemented in software such as a computer program for execution by suitable processing circuitry including one or more processing units. The software could be carried by a carrier, such as an electronic signal, an optical signal, a radio signal, or a computer readable storage medium before and/or during the use of the computer program e.g. in one or more nodes of the wireless communication network. The processing circuitry described above may be implemented in a so-called cloud solution, referring to that the implementation may be distributed, and may be referred to e.g. as being located in a so-called virtual node or a virtual machine.

The flow diagram or diagrams presented herein may be regarded as a computer flow diagram or diagrams, when performed by one or more processors. A corresponding arrangement or apparatus may be defined as a group of function modules, where each step performed by a processor corresponds to a function module. In this case, the function modules are implemented as one or more computer programs running on one or more processors.

Examples of processing circuitry includes, but is not limited to, one or more microprocessors, one or more Digital Signal Processors, DSPs, one or more Central Processing Units, CPUs, and/or any suitable programmable logic circuitry such as one or more Field Programmable Gate Arrays, FPGAs, or one or more Programmable Logic Controllers, PLCs. That is, the units or modules in the arrangements in the communication network described above could be implemented by a combination of analog and digital circuits in one or more locations, and/or one or more processors configured with software and/or firmware, e.g. stored in a memory. One or more of these processors, as well as the other digital hardware, may be included in a single application-specific integrated circuitry, ASIC, or several processors and various digital hardware may be distributed among several separate components, whether individually packaged or assembled into a system-on-a-chip, SOC.

It should also be understood that it may be possible to re-use the general processing capabilities of any conventional device or unit in which the proposed technology is implemented. It may also be possible to re-use existing software, e.g. by reprogramming of the existing software or by adding new software components.

The embodiments described above are merely given as examples, and it should be understood that the proposed technology is not limited thereto. It will be understood by those skilled in the art that various modifications, combinations and changes may be made to the embodiments without departing from the present scope. In particular, different part solutions in the different embodiments can be combined in other configurations, where technically possible.

When using the word "comprise" or "comprising" it shall be interpreted as non-limiting, i.e. meaning "consist at least of".

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of inventive concepts.

It is to be understood that the choice of interacting units, as well as the naming of the units within this disclosure are only for exemplifying purpose, and nodes suitable to execute any of the methods described above may be configured in a plurality of alternative ways in order to be able to execute the suggested procedure actions.

It should also be noted that the units described in this disclosure are to be regarded as logical entities and not with necessity as separate physical entities.

ABBREVIATIONS

ADC Analog to Digital Converter
ACLR Adjacent Carrier Leakage Ratio
CBW Channel Bandwidth
DPD Digital Pre-distortion
DRF Direct Radio Frequency
EVM Error Vector Magnitude
IBW Instantaneous Bandwidth
IM Intermodulation
I and Q In-phase and Quadrature phase
GSM Global System for Mobile Communications
LMS Least Mean Square
LTE Long Term Evolution
LUT Look-up Table
ULA Uniform Linear Array [Antenna]

PA Power Amplifier
RF Radio Frequency
WCDMA Wideband Code Division Multiple Access

The invention claimed is:

1. A method for linearization of an active antenna array to be performed by a transmitter arrangement; the active antenna array comprising a plurality of antenna elements, being associated with a plurality of power amplifiers, the active antenna array further being associated with a precoder W having a number of input and output ports; the method comprising:
obtaining a first signal $X_1$;
providing the obtained first signal $X_1$ to the active antenna array, via a first pre-distorting linearizer connected to a first input port of the precoder W;
obtaining a second signal $X_2$ different from the obtained first signal $X_1$;
providing the obtained second signal $X_2$ simultaneously with the obtained first signal $X_1$ to the active antenna array, via a second pre-distorting linearizer connected to a second input port of the precoder W; and
adapting the first pre-distorting linearizer connected to the first input port of the precoder W, based on the obtained first signal $X_1$, the obtained second signal $X_2$, and feedback of signals from the plurality of antenna elements resulting from the propagation of the obtained first signal $X_1$ via the precoder W, and via the plurality of power amplifiers.

2. The method according to claim 1, wherein the feedback of signals represents a signal transmitted by the active antenna array in a direction, in which unwanted emissions are to be minimized.

3. The method according to claim 2, wherein the direction is a beam direction associated with the first input port of the precoder W.

4. The method according to claim 1, wherein the feedback of signals from the plurality of antenna elements is obtained based on characteristics of the precoder W.

5. The method according to claim 1, wherein the adapting of the first pre-distorting linearizer comprises:
obtaining a measure of unwanted emissions resulting from a combined non-linearity of the plurality of power amplifiers associated with the plurality of antenna elements, wherein the measure is obtained based on the signals from the plurality of antenna elements and the obtained first signal $X_1$.

6. The method according to claim 1, wherein the adapting of the first pre-distorting linearizer comprises:
obtaining, based on the signals from the plurality of antenna elements and the obtained first signal $X_1$, a linear combination of non-linear intermodulation products resulting from the plurality of power amplifiers associated with the plurality of antenna elements.

7. The method according to claim 1, wherein the adapting of the first pre-distorting linearizer connected to the first input port of the precoder W comprises:
obtaining, based on the signals from the plurality of antenna elements, on the obtained first signal $X_1$, and on the obtained second signal $X_2$, a linear combination of non-linear intermodulation products resulting from the plurality of power amplifiers associated with the plurality of antenna elements.

8. The method according to claim 1, further comprising:
pre-distorting the obtained first signal $X_1$ based on the feedback of signals from the plurality of antenna elements.

9. A transmitter arrangement for linearization of an active antenna array; the active antenna array comprising a plurality of antenna elements, being associated with a plurality of power amplifiers, and further associated with a precoder W having a number of input and output ports; the transmitter arrangement being configured to:
obtain a first signal $X_1$;
provide the obtained first signal $X_1$ to the active antenna array, via a first pre-distorting linearizer connected to a first input port of the precoder W;
obtain a second signal $X_2$ different from the obtained first signal $X_1$;
provide the obtained second signal $X_2$ simultaneously with the obtained first signal $X_1$ to the active antenna array, via a second pre-distorting linearizer connected to a second input port of the precoder W; and
adapt the first pre-distorting linearizer connected to the first input port of the precoder W, based on the obtained first signal $X_1$, the obtained second signal $X_2$, and feedback of signals from the plurality of antenna elements resulting from the propagation of the obtained first signal $X_1$ via the precoder W, and via the plurality of power amplifiers.

10. The transmitter arrangement according to claim 9, being further configured to obtain the feedback of signals as a representation of a signal transmitted by the active antenna array in a direction, in which unwanted emissions are to be minimized.

11. The transmitter arrangement according to claim 9, being configured to obtain the feedback of signals as a representation of a signal transmitted by the active antenna array in a beam direction associated with the first input port of the precoder W.

12. The transmitter arrangement according to claim 9, being configured to obtain the feedback of signals from the plurality of antenna elements based on characteristics of the precoder W.

13. The transmitter arrangement according to claim 9, wherein to adapt the first pre-distorting linearizer, the transmitter arrangement is configured to:
obtain, based on the signals from the plurality of antenna elements and the obtained first signal $X_1$, a measure of unwanted emissions resulting from a combined non-linearity of the plurality of power amplifiers associated with the plurality of antenna elements.

14. The transmitter arrangement according to claim 9, wherein to adapt the first pre-distorting linearizer, the transmitter arrangement is configured to:
obtain, based on the signals from the plurality of antenna elements and the obtained first signal $X_1$, a linear combination of non-linear intermodulation products resulting from the plurality of power amplifiers associated with the plurality of antenna elements.

15. The transmitter arrangement according to claim 9, wherein to adapt the first pre-distorting linearizer, the transmitter arrangement is configured to:
obtain, based on the signals from the plurality of antenna elements, on the obtained first signal $X_1$, and on the obtained second signal $X_2$, a linear combination of non-linear intermodulation products resulting from the plurality power amplifiers associated with the plurality of antenna elements.

16. The transmitter arrangement according to claim 9, further configured to:
pre-distort the obtained first signal $X_1$ based on the feedback of signals from the plurality of antenna elements.

17. A non-transitory computer-readable storage medium embedded with a computer program product including instructions executed by at least one processor to cause the at least one processor to:
- obtain a first signal $X_1$;
- provide the obtained first signal $X_1$ to an active antenna array, via a first pre-distorting linearizer connected to a first input port of a precoder W;
- obtain a second signal $X_2$ different from the obtained first signal $X_1$;
- provide the obtained second signal $X_2$ simultaneously with the obtained first signal $X_1$ to the active antenna array, via a second pre-distorting linearizer connected to a second input port of the precoder W; and
- adapt the first pre-distorting linearizer connected to the first input port of the precoder W based on the obtained first signal $X_1$, the obtained second signal $X_2$, and feedback of signals from a plurality of antenna elements of the active antenna array resulting from the propagation of the obtained first signal $X_1$ via the precoder W and via a plurality of power amplifiers that are respectively associated with the plurality of antenna elements.

18. The non-transitory computer-readable storage medium according to claim 17, wherein the feedback of signals represents a signal transmitted by the active antenna array in a direction, in which unwanted emissions are to be minimized.

19. The non-transitory computer-readable storage medium according to claim 18, wherein the direction is a beam direction associated with the first input port of the precoder W.

20. The non-transitory computer-readable storage medium according to claim 17, wherein the feedback of signals from the plurality of antenna elements is obtained based on characteristics of the precoder W.

* * * * *